(12) United States Patent
Chen et al.

(10) Patent No.: US 11,903,159 B2
(45) Date of Patent: Feb. 13, 2024

(54) ELECTRONIC DEVICE AND POWER DISTRIBUTION MODULE

(71) Applicant: Wistron Corporation, New Taipei (TW)

(72) Inventors: Jun-Hong Chen, New Taipei (TW); Yong-Qing Zhong, New Taipei (TW); Yisheng Chen, New Taipei (TW); Zhao-Ping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/717,154

(22) Filed: Apr. 11, 2022

(65) Prior Publication Data

US 2023/0301009 A1 Sep. 21, 2023

(30) Foreign Application Priority Data

Mar. 16, 2022 (CN) .......................... 202210258405.X

(51) Int. Cl.
*H05K 7/14* (2006.01)
(52) U.S. Cl.
CPC ......... *H05K 7/1457* (2013.01); *H05K 7/1401* (2013.01); *H05K 7/1492* (2013.01)

(58) Field of Classification Search
CPC ... H05K 7/1457; H05K 7/1401; H05K 7/1492
See application file for complete search history.

(56) References Cited

U.S. PATENT DOCUMENTS 7,771,218 B2 * 8/2010 Jaramillo ............. H05K 7/1492 439/157

\* cited by examiner

*Primary Examiner* — Anthony Q Edwards
*Assistant Examiner* — Hung Q Dang
(74) *Attorney, Agent, or Firm* — JCIPRNET

(57) ABSTRACT

An electronic device includes a device body and a power distribution module. The power distribution module includes a main body, a handle, at least one first frame and at least one first elastic member. The main body is detachably disposed on the device body. The handle is rotatably connected to the main body. The at least one first frame is slidably disposed on the device body. The at least one first elastic member is connected between the device body and the at least one first frame. The at least one first frame blocks the handle by an elastic force of the at least one first elastic member, so that the main body is limited on the device body. In addition, a power distribution module suitable for the electronic device is also provided.

18 Claims, 23 Drawing Sheets

ELECTRONIC DEVICE AND POWER DISTRIBUTION MODULE

CROSS-REFERENCE TO RELATED APPLICATION

This application claims the priority benefit of China application serial no. 202210258405.X filed on 2022 Mar. 16. The entirety of the above-mentioned patent application is hereby incorporated by reference herein and made a part of this specification.

BACKGROUND

Technical Field

The disclosure relates to an electronic device and an electronic member, and in particular, relates to an electronic device and a power distribution module thereof.

Description of Related Art

With the development of servers, a stable power supply has become an essential requirement for servers. In view of this, recent servers are equipped with multiple power supply modules to provide stable power, and the provided power is distributed through a power distribution module. The power distribution module is plugged into the main body of the server, and the power supply modules are respectively plugged into the power distribution module, so that each of the power supply modules supplies power to the server through the power distribution module.

However, when the power distribution module is plugged into the main body of the server, the friction between the two connectors of the power supply module and the main body is often too large, so that the power distribution module is not easily plugged in or removed from the main body of the server. Moreover, after the power distribution module is plugged into the main body of the server, the connection may easily fail because the connectors of the power supply module and the main body are not tightly matched.

SUMMARY

The disclosure provides an electronic device and a power distribution module, so that a main body of the power distribution module may be firmly plugged into a device body of the electronic device.

An electronic device of the disclosure includes a device body and a power distribution module. The power distribution module includes a main body, a handle, at least one first frame, and at least one first elastic member, the main body is detachably disposed on the device body, the handle is rotatably connected to the main body, the at least one first frame is slidably disposed on the device body, the at least one first elastic member is connected between the device body and the at least one first frame. The at least one first frame blocks the handle by an elastic force of the at least one first elastic member, so that the main body is limited on the device body.

The power distribution module of the disclosure is suitable for an electronic device. The power distribution module includes a main body, a handle, at least one first frame, and at least one first elastic member. The main body is detachably disposed on a device body of the electronic device. The handle is rotatably connected to the main body. The at least one first frame is slidably disposed on the device body. The at least one first elastic member is connected between the device body and the at least one first frame, the at least one first frame blocks the handle by an elastic force of the at least one first elastic member, so that the main body is limited on the device body.

In an embodiment of the disclosure, when the handle is rotated relative to the main body from a release position to a locking position, the handle resists the elastic force of the at least one first elastic member to drive the at least one first frame to slide relative to the device body.

In an embodiment of the disclosure, the main body includes a chassis and at least one second frame, the at least one second frame is slidably disposed on the chassis, the handle is rotatably connected to the at least one second frame and is slidably disposed on the chassis. The device body has a motherboard connector, the handle is suitable for driving the chassis to slide relative to the motherboard connector.

In an embodiment of the disclosure, the main body includes at least one second elastic member, the at least one second elastic member is connected between the chassis and the at least one second frame.

In an embodiment of the disclosure, the at least one first frame is slidably disposed on the device body along a sliding direction, the at least one second frame is slidably disposed on the chassis along the sliding direction.

In an embodiment of the disclosure, the handle includes a pivot portion, a blocking portion, and a sliding portion, the pivot portion is located between the blocking portion and the sliding portion and is pivotally connected to the at least one second frame, the blocking portion is suitable for being blocked by the at least one first frame, the sliding portion is slidably disposed on the chassis.

In an embodiment of the disclosure, the handle includes a sliding portion, the sliding portion includes a sliding slot, the chassis includes a protruding post, the protruding post is slidably disposed on the sliding slot. The sliding slot includes a first section and a second section respectively extending in different directions, the protruding post slides on the first section and the second section through the handle.

In an embodiment of the disclosure, the power distribution module includes at least one hook member, at least one third elastic member, and a linking member. The at least one third elastic member is connected between the linking member and the handle, the at least one hook member is rotatably connected to the handle and is pivotally connected to the linking member, the linking member is suitable for hooking the at least one hook member to the main body through the at least one third elastic member to position the handle.

In an embodiment of the disclosure, the electronic device includes a box body and at least one power supply module, the power distribution module includes an anti-disassembly bracket. The anti-disassembly bracket is slidably disposed on the box body, the anti-disassembly bracket is suitable for blocking the handle from rotating relative to the main body.

In an embodiment of the disclosure, the power distribution module includes at least one fourth elastic member, the at least one fourth elastic member is connected between the box body and the anti-disassembly bracket, the power supply module is disposed inside the box body so that the anti-disassembly bracket is limited on a blocking position. When the power supply module is moved away from the box body, the anti-disassembly bracket is moved away from the blocking position by an elastic force of the at least one fourth elastic member.

Based on the above, in the electronic device of the disclosure, when the handle of the power distribution module is pulled to drive the main body of the power distribution module to move toward the device body of the electronic device, the first frame slidably disposed on the device body is driven by the handle to move upwards, so that the first elastic member connected between the device body and the first frame is stretched. Therefore, the first frame limits the main body of the power distribution module to the device body through the elastic force of the first elastic member, so that the main body of the power distribution module is firmly plugged into the device body.

DETAILED DESCRIPTION OF DISCLOSED EMBODIMENTS

Figure 1:
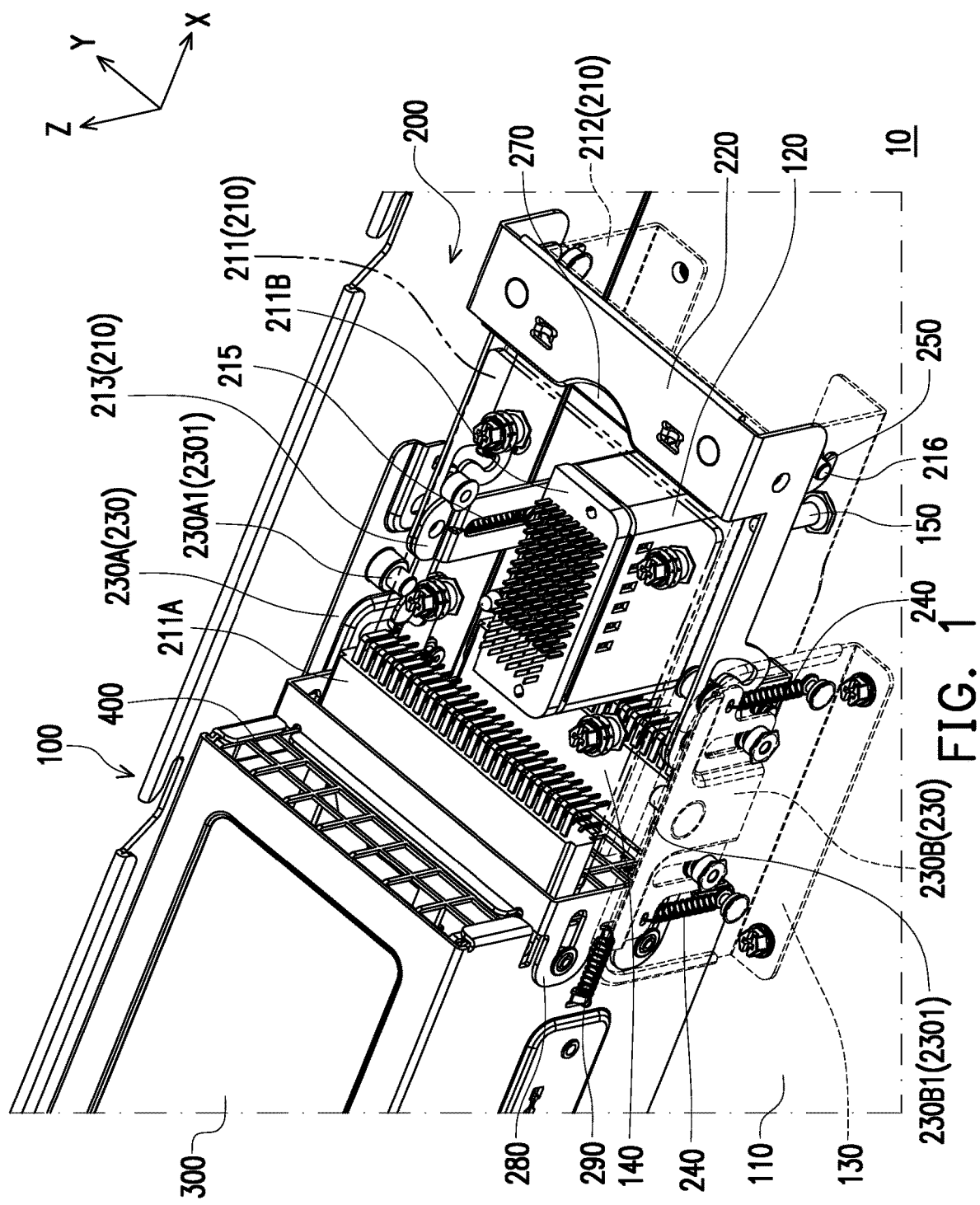
FIG. 1 is a perspective view of an electronic device according to an embodiment of the disclosure.
Figure 2:
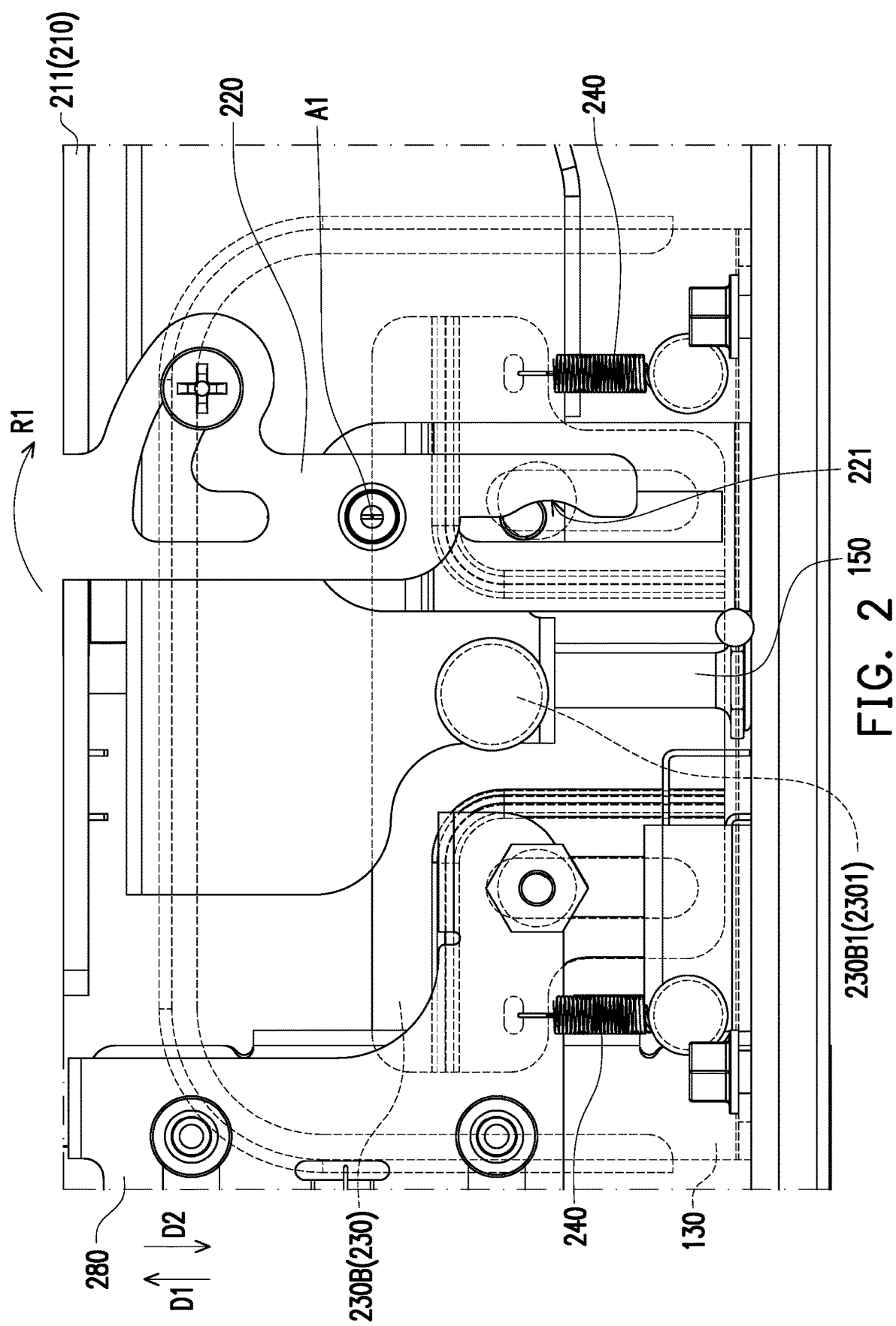
FIG. 2 is a side view of a handle of FIG. 1 in a release position relative to the main body.
Figure 3:
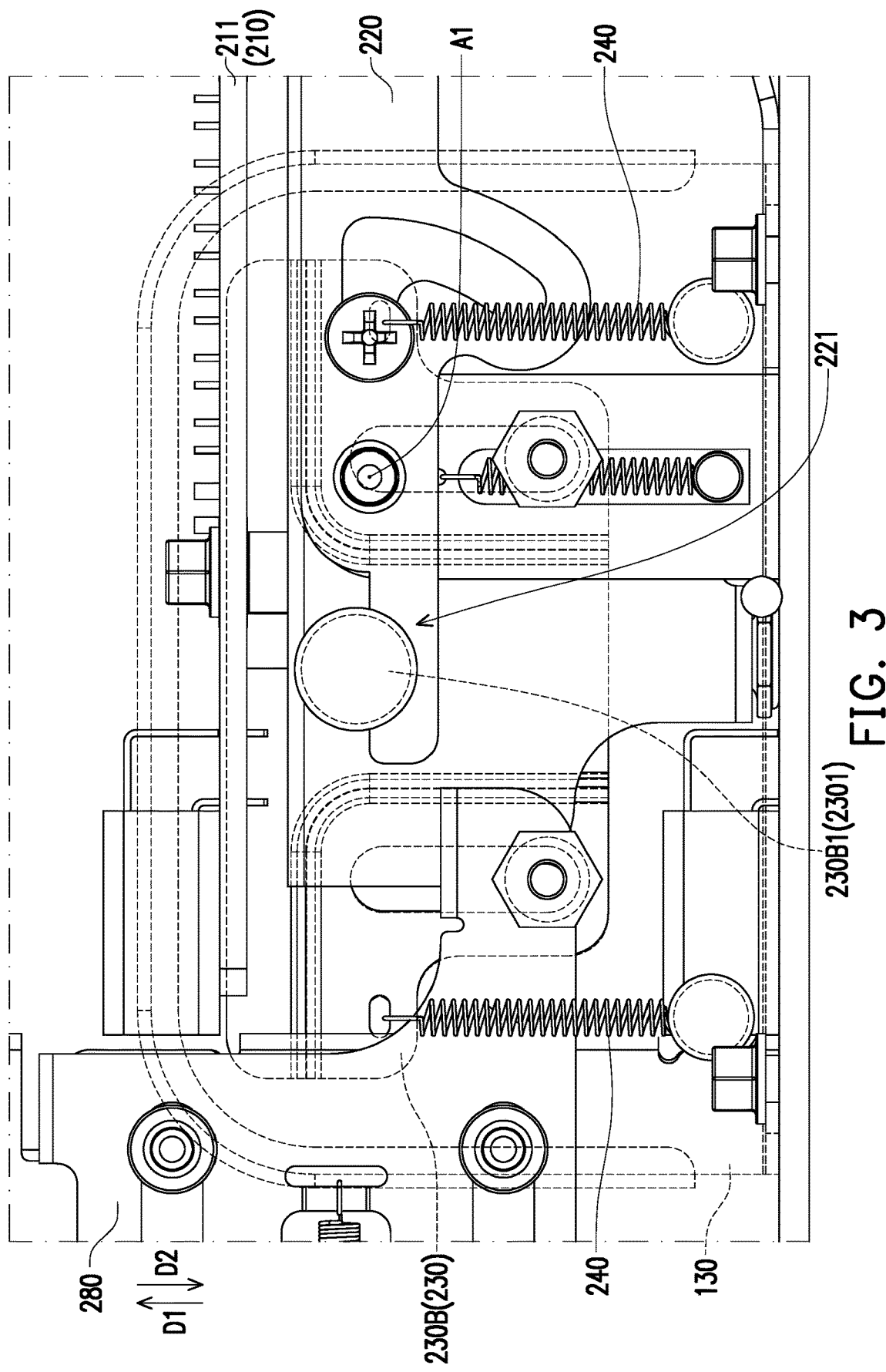
FIG. 3 is a side view of the handle of FIG. 1 in a locking position relative to the main body.

FIG. 1 is a perspective view of an electronic device according to an embodiment of the disclosure, FIG. 2 is a side view of a handle of FIG. 1 in a release position relative to the main body, FIG. 3 is a side view of the handle of FIG. 1 in a locking position relative to the main body. Referring to FIG. 1 to FIG. 3, an electronic device 10 of this embodiment includes a device body 100 and a power distribution module 200. The power distribution module 200 includes a main body 210, a handle 220, at least one first frame 230 (two are shown) and at least one first elastic member 240 (two are shown). The main body 210 is detachably disposed on the device body 100, and the handle 220 is rotatably connected to the main body 210. The first frame 230 is slidably disposed on the device body 100 along an operating direction D2, the first elastic member 240 is connected between the device body 100 and the first frame 230, the handle 220 may rotate along a rotating direction R1 with a rotating axis A1 as an axis. In some embodiments, the handle 220 includes a blocking portion 221, the first frame 230 includes a blocking flange 2301, the blocking flange 2301 is suitable for blocking the blocking portion 221. After the handle 220 is rotated along the rotating direction R1, the blocking portion 221 of the handle 220 contacts the blocking flange 2301 of the first frame 230 to limit the movement of the handle 220 in a sliding direction D1. The first elastic member 240 in this embodiment is a tension spring, but the disclosure is not limited thereto.

In this embodiment, the main body 210 of the power distribution module 200 includes a power adapter board 211, and the power adapter board 211 is configured with a first connector 211A and a second connector 211B. In addition, the device body 100 includes a motherboard 110 and a motherboard connector 120 configured on the motherboard 110. The second connector 211B is suitable for connecting with the motherboard connector 120, so that the main body 210 may be detachably disposed on the device body 100.

In this configuration, when the handle 220 is rotated relative to the main body 210 from a release position P1 shown in FIG. 2 and along the rotating direction R1 to a locking position P2 shown in FIG. 3 with the rotating axis A1 as the axis, the second connector 211B is connected to the motherboard connector 120 as shown in FIG. 1, the blocking flange 2301 of the first frame 230 blocks the blocking portion 221 of the handle 220 as shown in FIG. 3, and the first elastic member 240 connected between the device body 100 and the first frame 230 is stretched during the blocking period to generate an elastic force along the operating direction D2. The blocking flange 2301 resists the elastic force of the first elastic member 240 and drives the first frame 230 to slide relative to the device body 100 along the sliding direction D1. The elastic force of the first elastic member 240 is suitable for blocking the handle 220 and limiting the main body 210 connected to the handle 220 to the device body 100, thereby preventing the second connector 211B and the motherboard connector 120 from loosening and ensuring a stable operation for the power distribution module 200.

Figure 4:
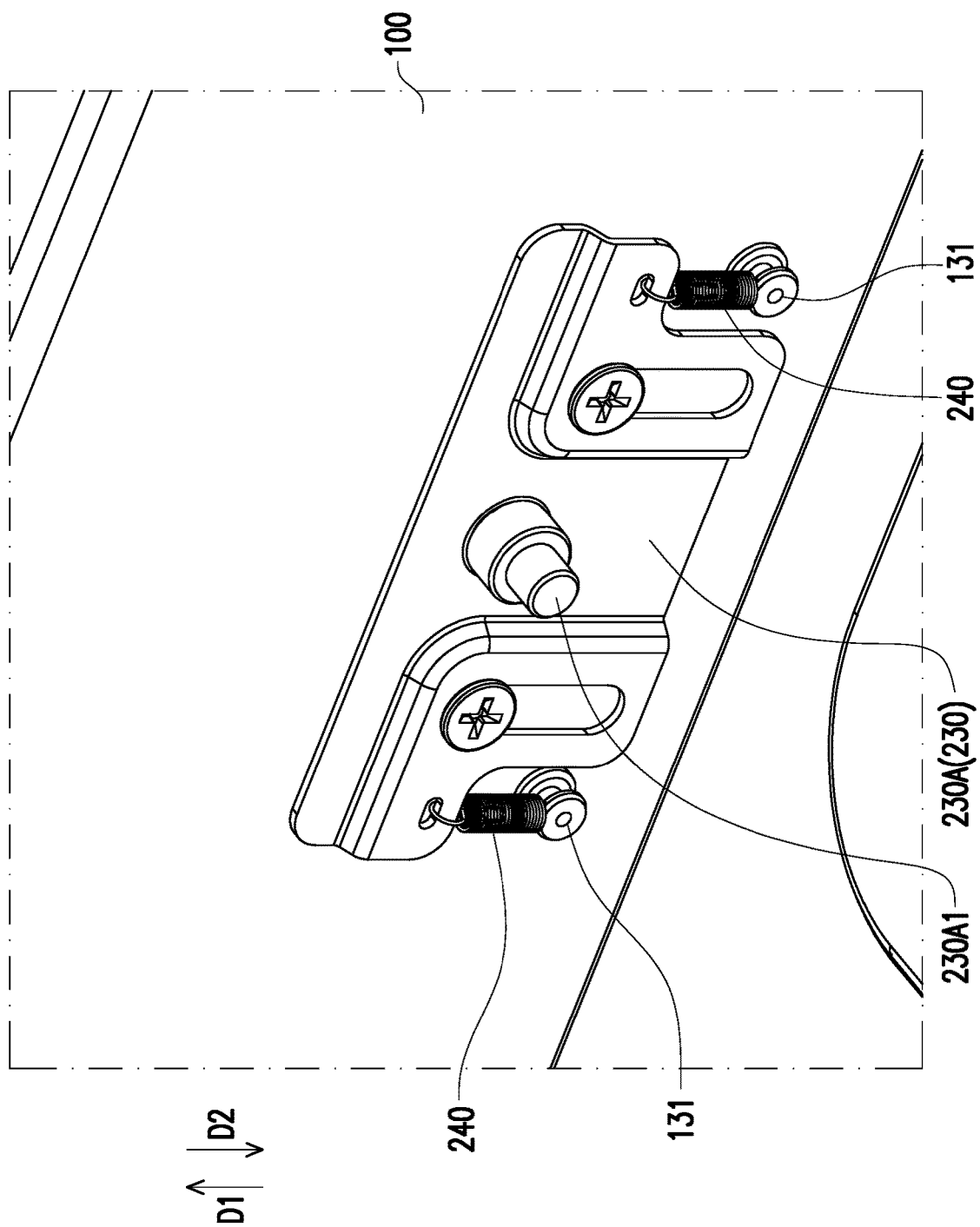
FIG. 4 is a perspective view of a first frame of FIG. 1.
Figure 5:
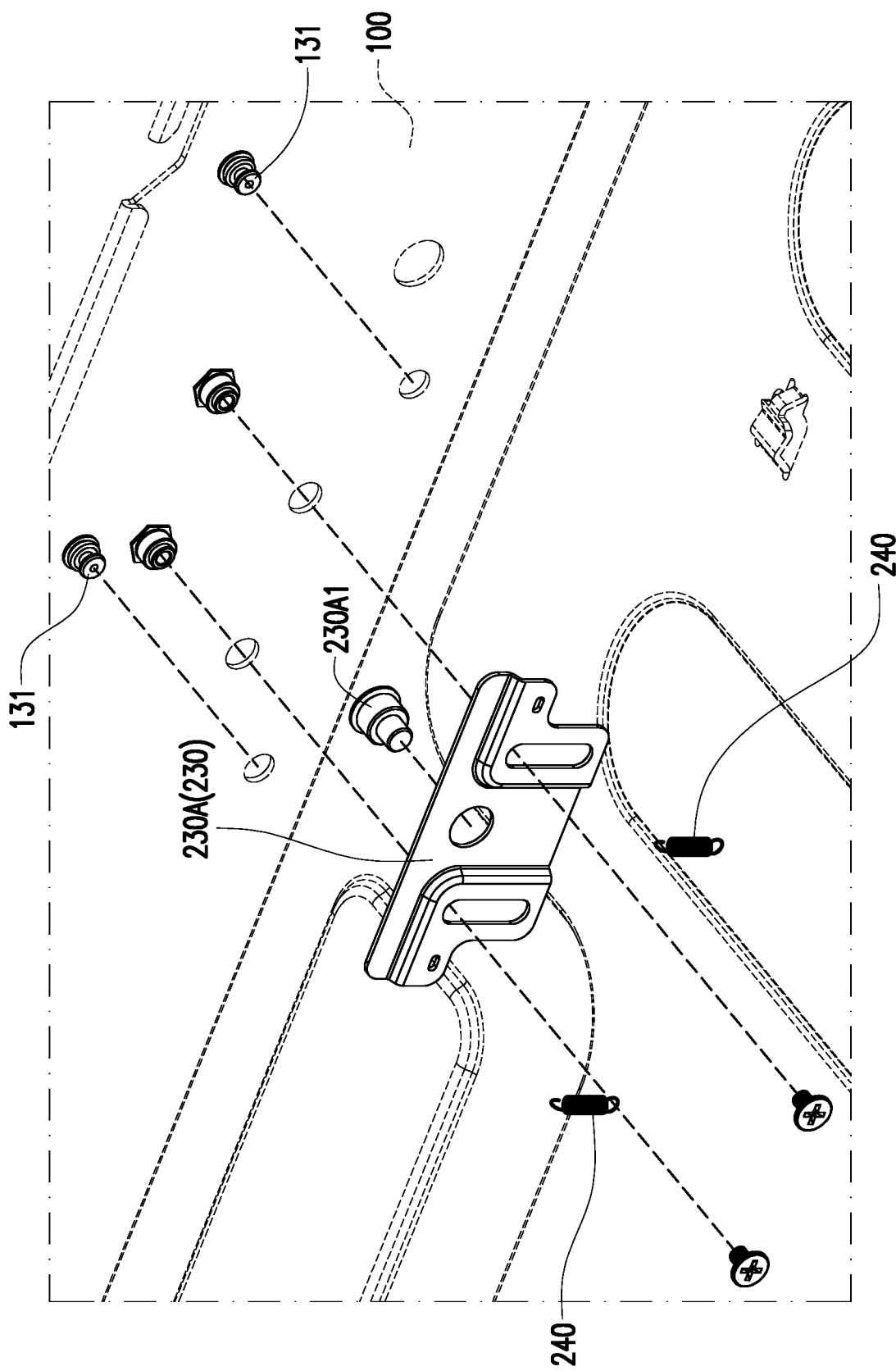
FIG. 5 is an exploded view of the first frame of FIG. 4.
Figure 6:
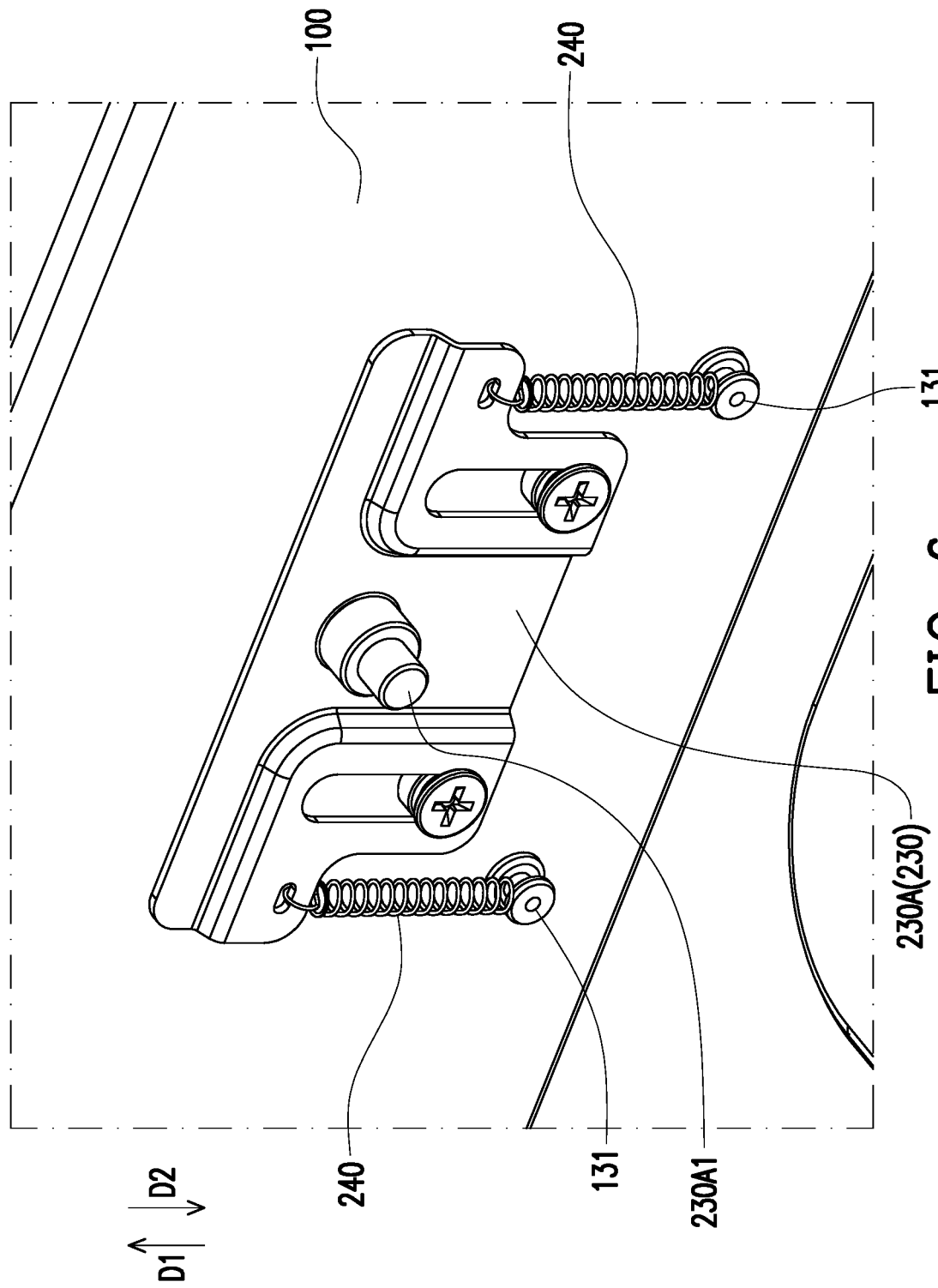
FIG. 6 is a perspective view of the first frame of FIG. 4 after moving relative to the device body.

The specific configuration of the first frame 230 in this embodiment is described below. FIG. 4 is a perspective view of a first frame of FIG. 1, FIG. 5 is an exploded view of the first frame of FIG. 4, FIG. 6 is a perspective view of the first frame of FIG. 4 after moving relative to the device body. Referring to FIG. 1, FIG. 4, FIG. 5, and FIG. 6, the two first frames 230 (230A, 230B) of this embodiment are respectively configured on two sides of a chassis 212. The first frame 230A on one side is movably configured on the device body 100, a blocking flange 230A1 is disposed on the device body 100 and passes through the first frame 230A. Both terminals of the first elastic member 240 are respectively connected to the first frame 230A and a lug 131, and the lug 131 is disposed on the device body 100.

Figure 7:
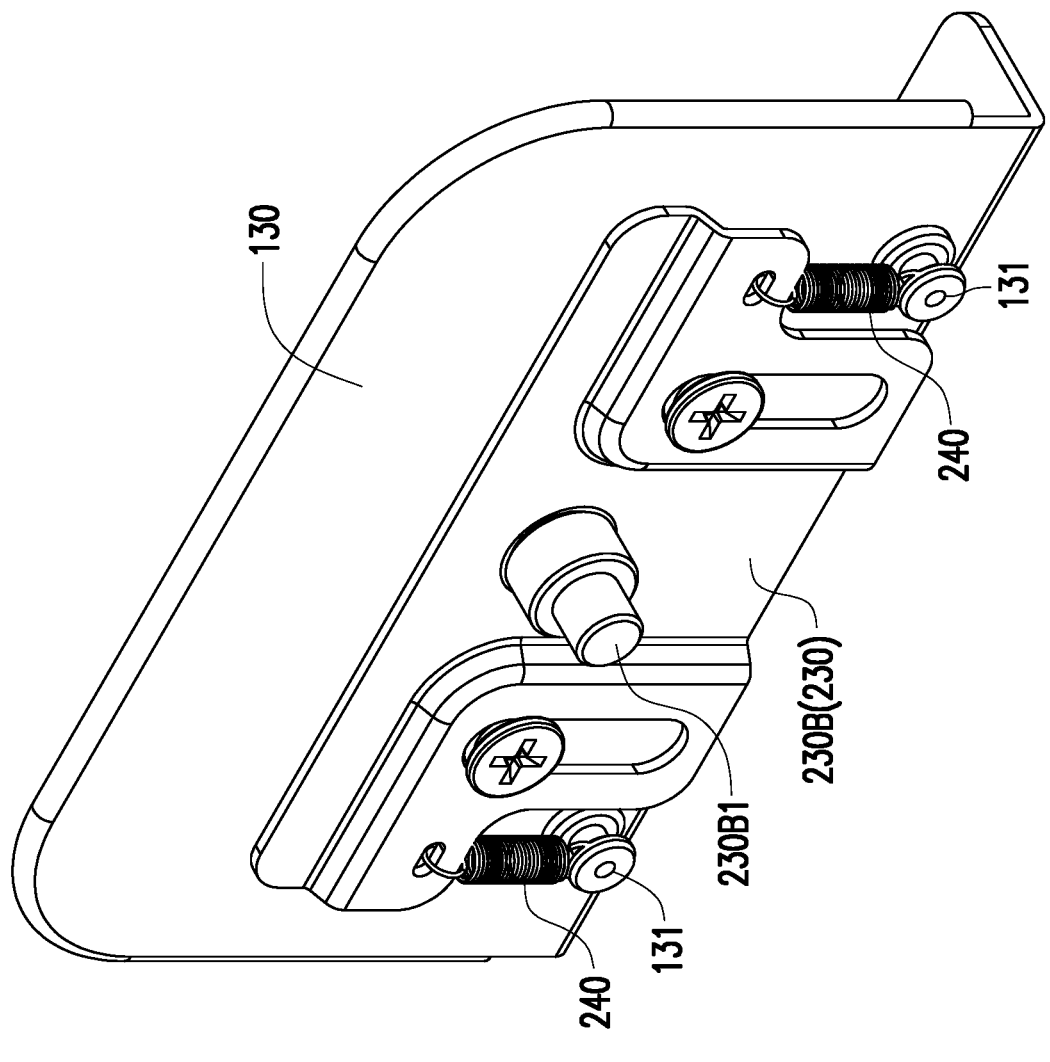
FIG. 7 is a perspective view of another first frame of FIG. 1.
Figure 8:
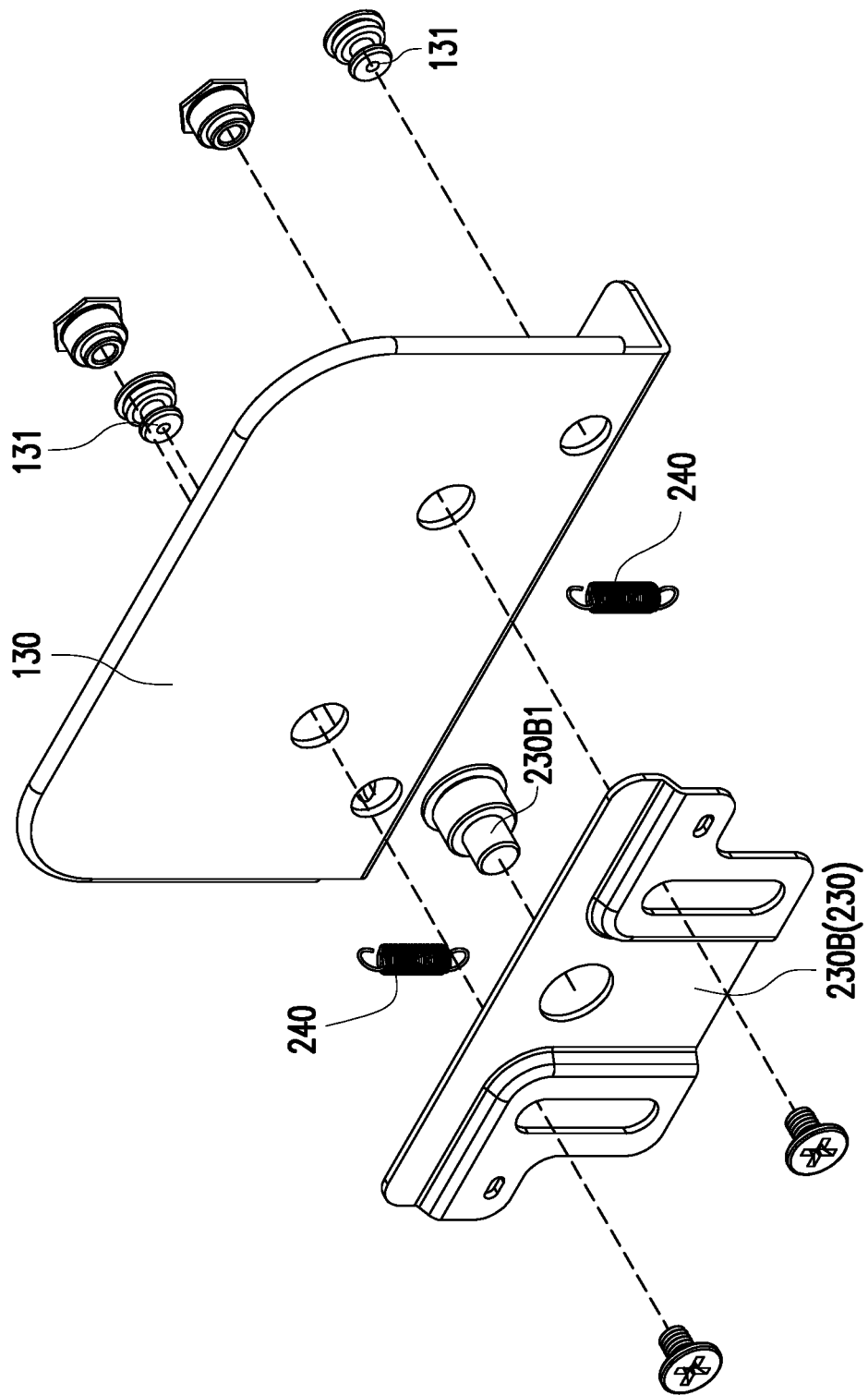
FIG. 8 is an exploded view of the first frame of FIG. 7.
Figure 9:
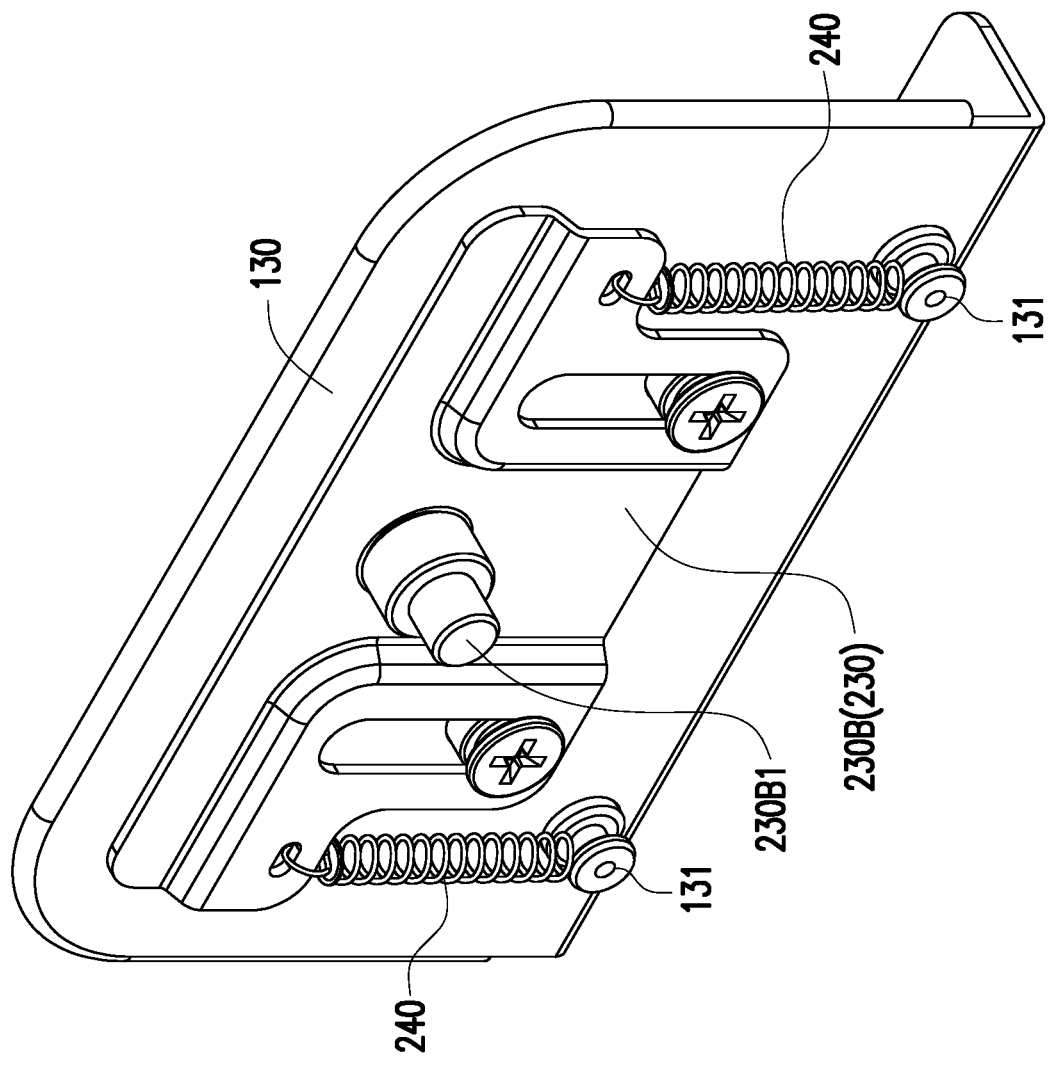
FIG. 9 is a perspective view of the first frame of FIG. 7 after moving relative to a fixing frame.

FIG. 7 is a perspective view of another first frame of FIG. 1, FIG. 8 is an exploded view of the first frame of FIG. 7, FIG. 9 is a perspective view of the first frame of FIG. 7 after moving relative to a fixing frame. Referring to FIG. 1, FIG. 7, FIG. 8, and FIG. 9, the first frame 230B on the other side is movably configured on a fixing frame 130, and the fixing frame 130 is locked on the motherboard 110 of the device body 100. A blocking flange 230B1 is disposed on the fixing frame 130 and passes through the first frame 230B. Both terminals of the first elastic member 240 are respectively connected to the first frame 230B and the lug 131, and the lug 131 is disposed on the fixing frame 130. In other embodiments, the first frame 230A and the first frame 230B may be configured on the device body 100 or the fixing frame 130 in other suitable manners, which are not limited in the disclosure.

Figure 10:
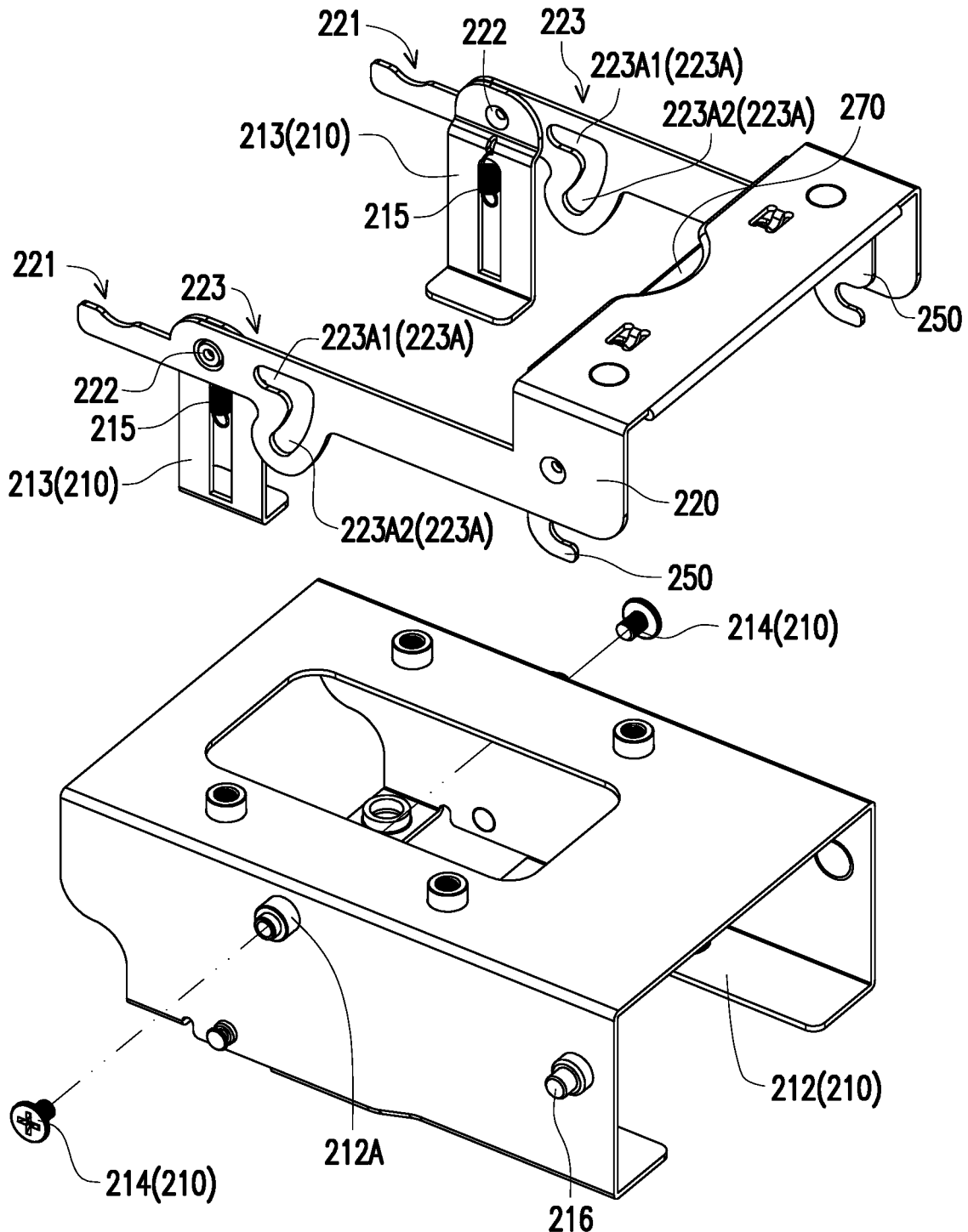
FIG. 10 is an exploded view of some components of the power distribution module of FIG. 1.
Figure 11A:
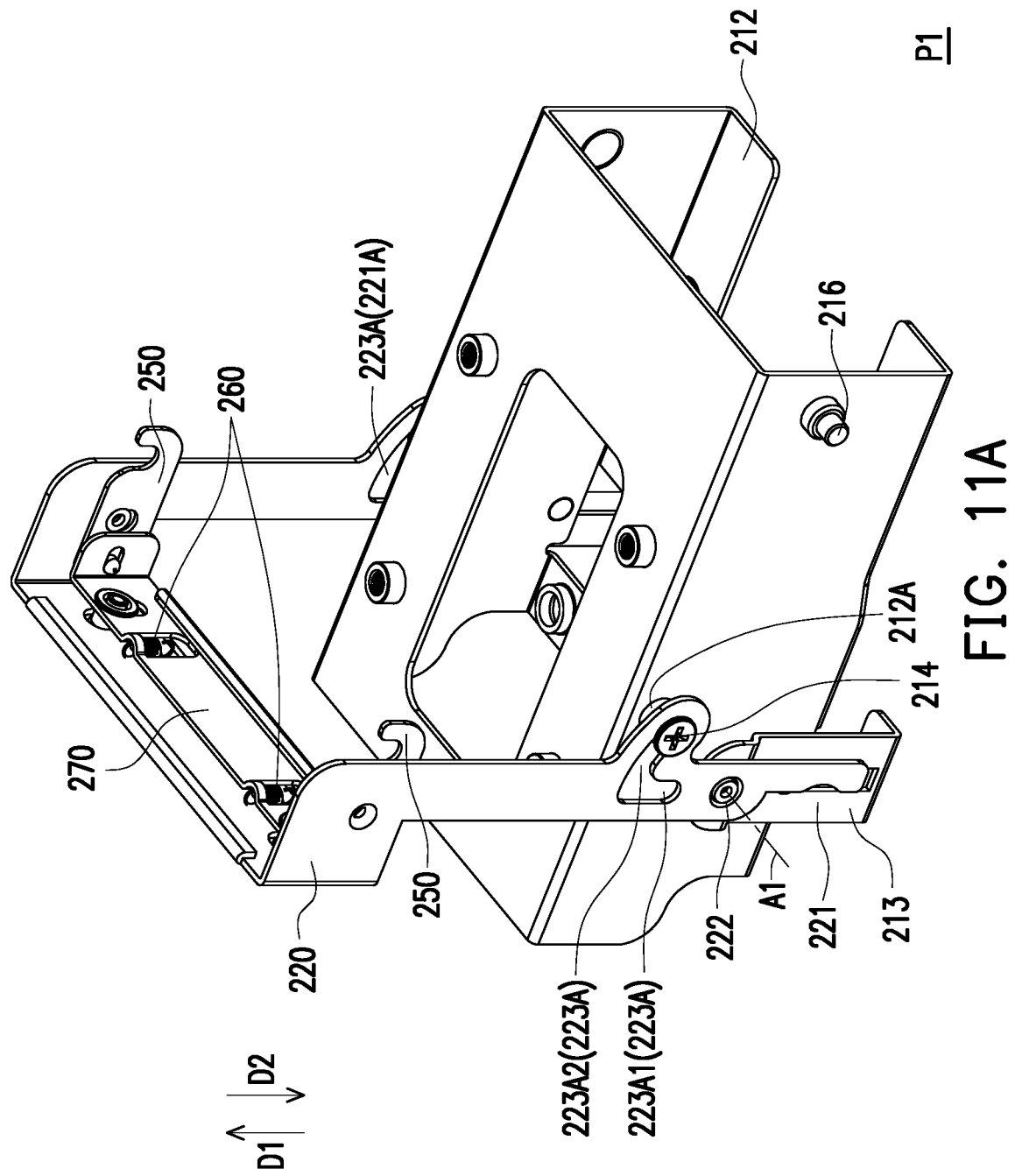
FIG. 11A to FIG. 11C are operational flowcharts of some components of the power distribution module of FIG. 1.
Figure 11B:
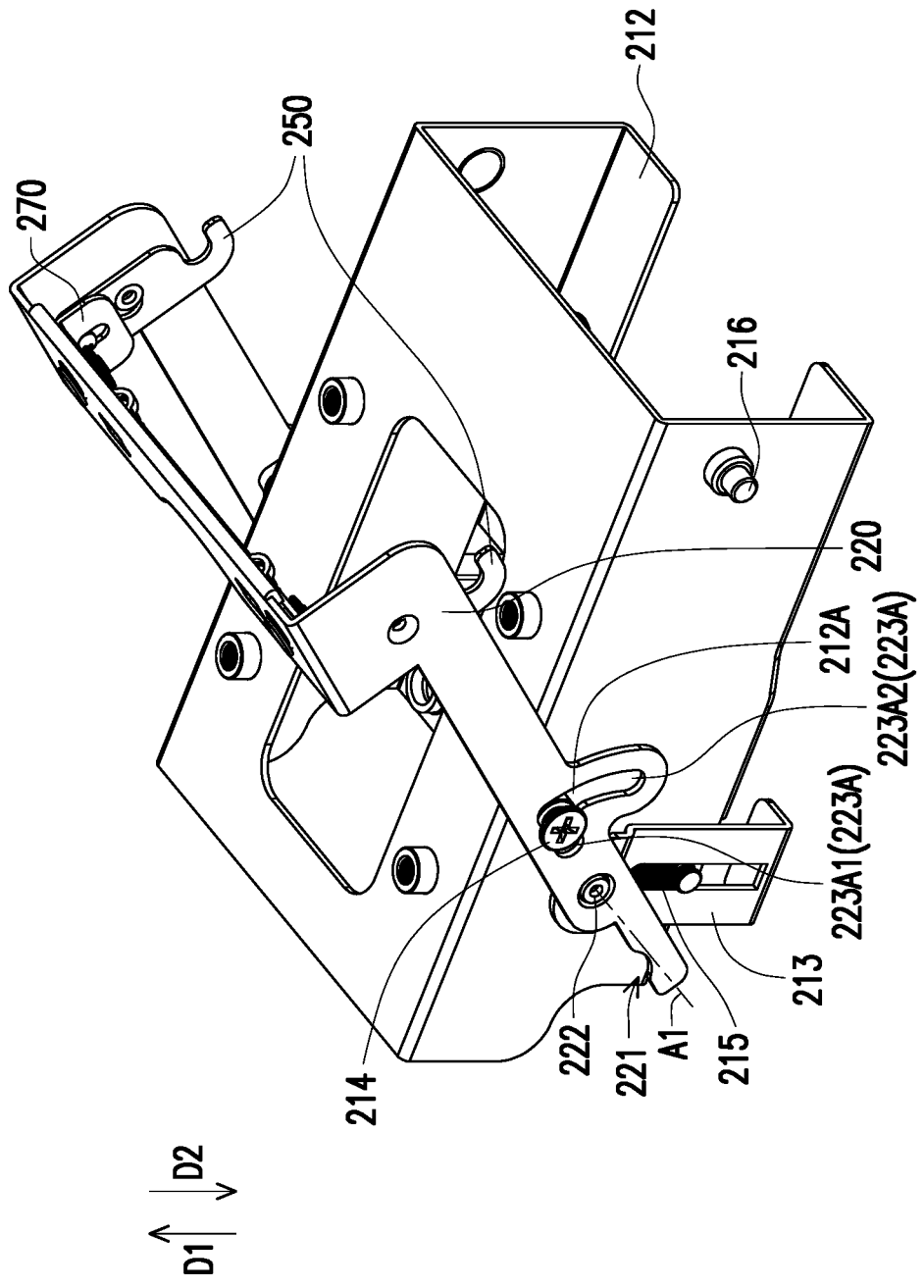
Figure 11C:
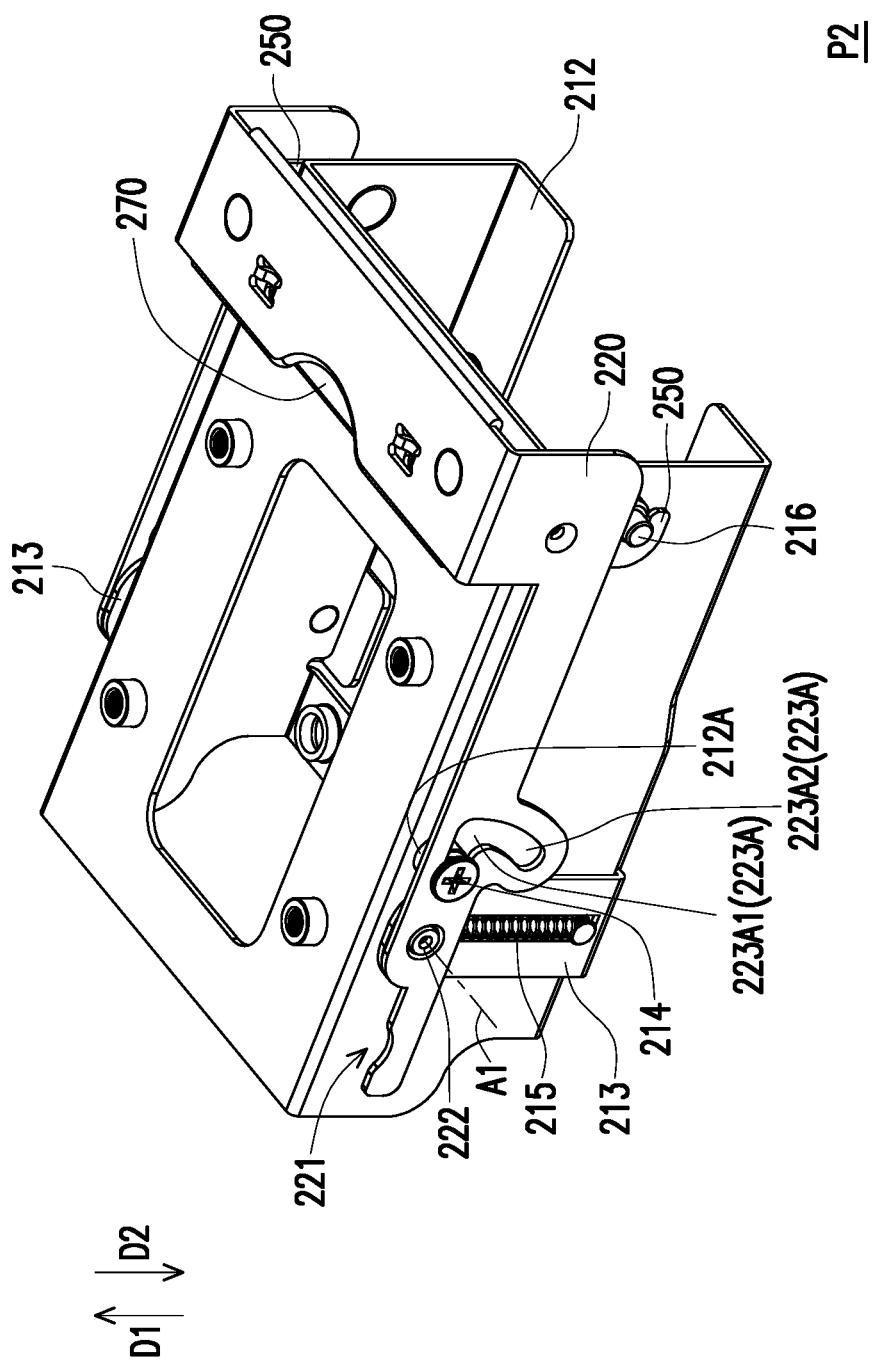

FIG. 10 is an exploded view of some components of the power distribution module of FIG. 1, FIG. 11A to FIG. 11C are operational flowcharts of some components of the power distribution module of FIG. 1. Referring to FIG. 10 to FIG. 11C, in detail, the main body 210 of the power distribution module 200 of this embodiment further includes a chassis 212, at least one second frame 213, at least one locking member 214, and at least one second elastic member 215. The number of the at least one second frame 213, the at least one locking member 214, and the at least one second elastic member 215 is two. The second frame 213 is slidably disposed on the chassis 212 along the sliding direction D1, the second elastic member 215 is connected between the chassis 212 and the second frame 213. The handle 220 is rotatably connected to the second frame 213 through a pivot portion 222, and the handle 220 may be slidably connected to the chassis 212. In addition, the chassis 212 has at least one protruding post 212A, the locking member 214 is locked on the protruding post 212A to prevent the handle 220 and the second frame 213 from being separated from the chassis 212. The second elastic member 215 in this embodiment is a tension spring, but the disclosure is not limited thereto.

In addition, the handle 220 includes a sliding portion 223 slidably disposed on the chassis 212. The pivot portion 222 is located between the blocking portion 221 and the sliding portion 223, and is pivotally connected to the second frame 213. The sliding portion 223 includes a sliding slot 223A, and the sliding slot 223A includes a first section 223A1 and a second section 223A2 respectively extending in different directions. The protruding post 212A is slidably disposed on the sliding slot 223A, and may slide in the first section 223A1 and the second section 223A2.

The operation of the power distribution module 200 and the handle 220 of this embodiment is described below. When the pivot portion 222 of the handle 220 is rotated from the release position P1 shown in FIG. 11A to the position shown in FIG. 11B with the rotating axis A1 as the axis, the protruding post 212A is located in the second section 223A2. When the pivot portion 222 of the handle 220 is rotated from the position shown in FIG. 11B to the locking position P2 shown in FIG. 11C with the rotating axis A1 as the axis, the protruding post 212A is located in the first section 223A1. When the protruding post 212A slides along the second section 223A2, the relative position between the chassis 212 and the second frame 213 remains unchanged, and the second elastic member 215 is in an unstretched state. The second section 223A2 is designed as an arc with the pivot portion 222 as the center of the circle, maintaining the relative position between the chassis 212 and the second frame 213. When the protruding post 212A slides along the first section 223A1, the handle 220 pushes the protruding post 212A of the chassis 212 and drives the chassis 212 to slide relative to the second frame 213 along the sliding direction D1, the second elastic member 215 connected between the chassis 212 and the second frame 213 changes from the unstretched state shown in FIG. 11B to a stretched state shown in FIG. 11C.

Figure 12A:
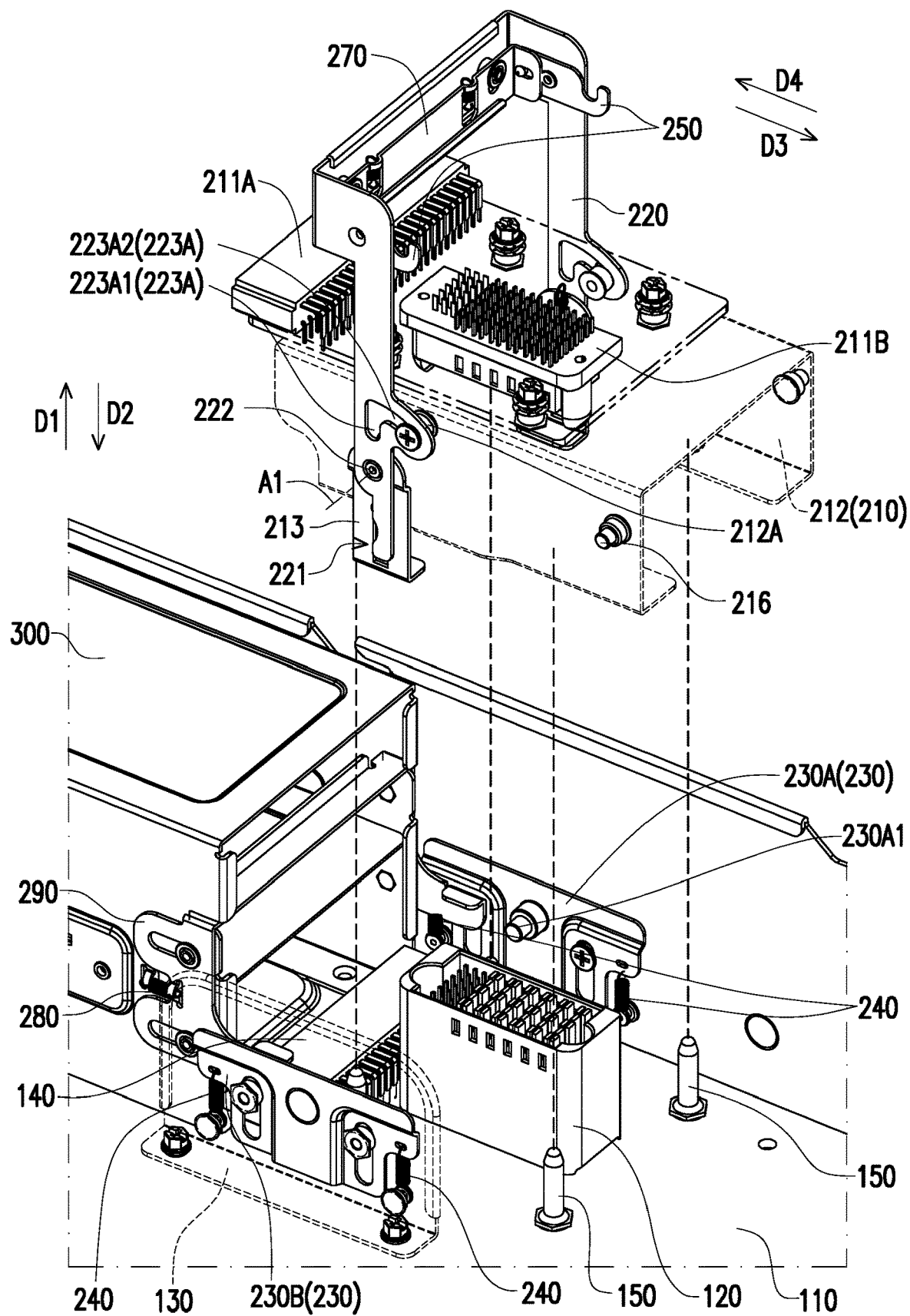
FIG. 12A to FIG. 12C are operational flowcharts of the power distribution module of FIG. 1 during an installation process.
Figure 12B:
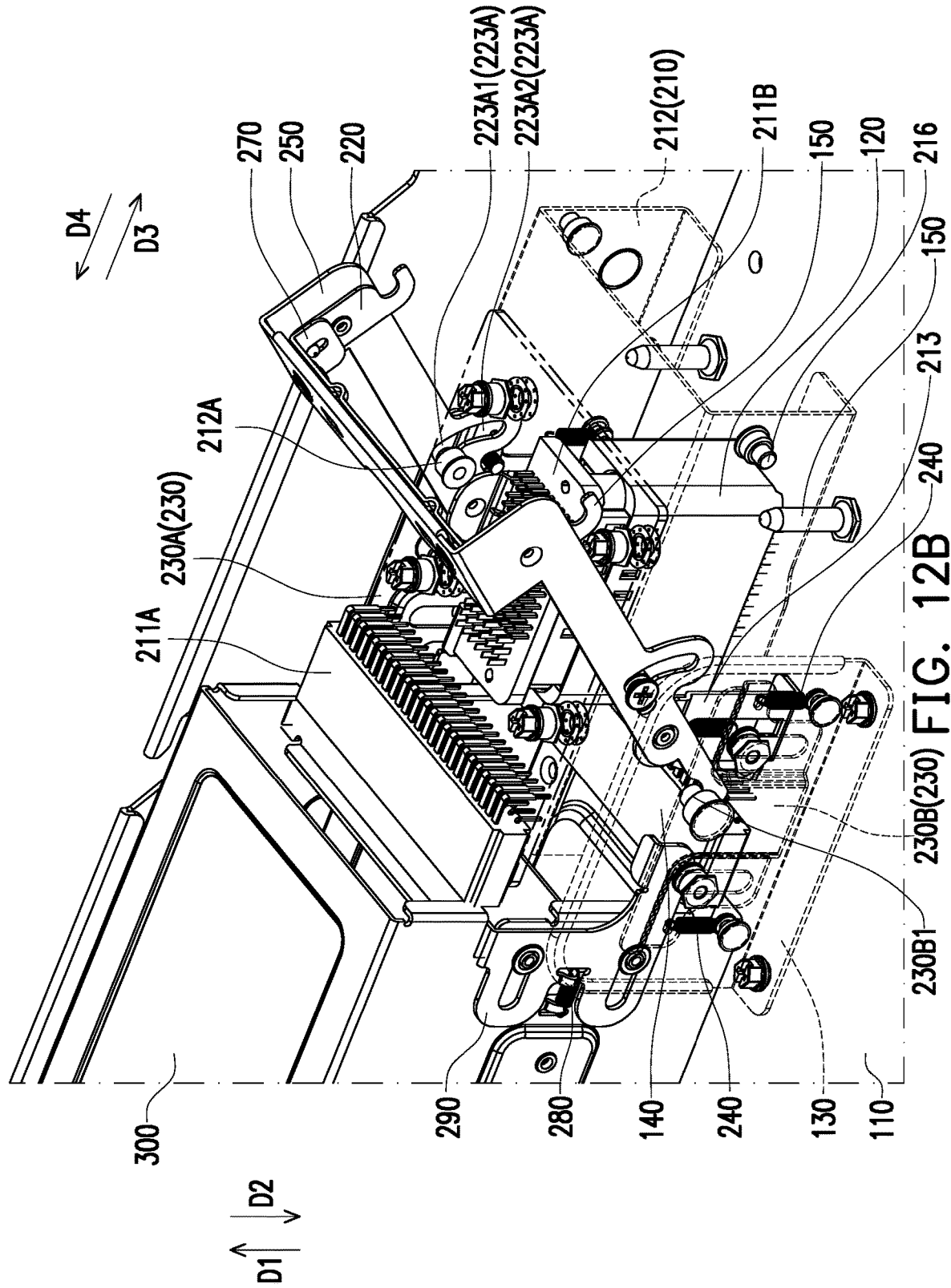
Figure 12C:
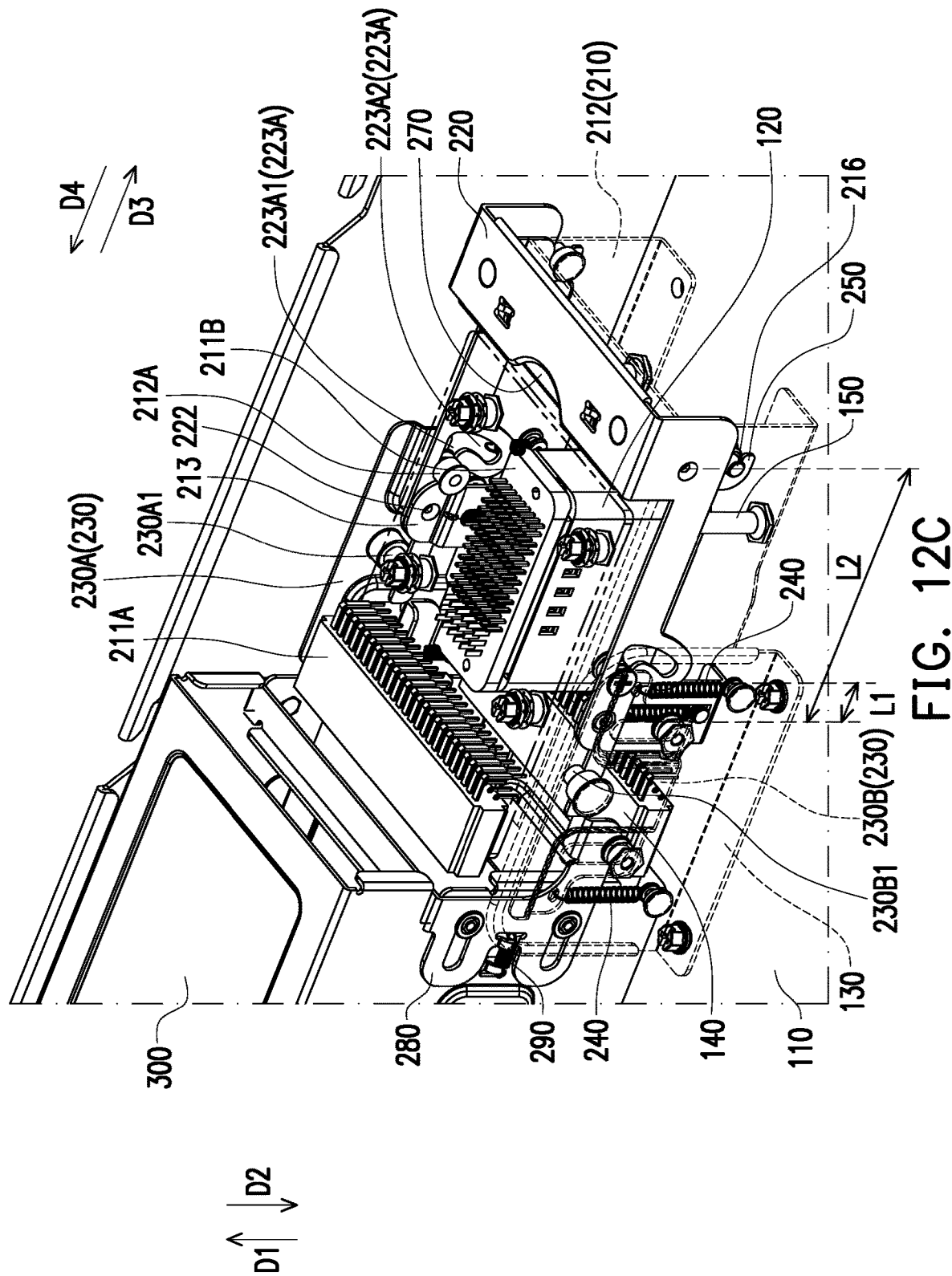

The overall operation of the power distribution module 200 of this embodiment installed on the device body 100 is described below. FIG. 12A to FIG. 12C are operational flowcharts of the power distribution module of FIG. 1 during an installation process. Referring to FIG. 1, FIG. 12A to FIG. 12C, the device body 100 of this embodiment further includes a third connector 140 and at least one guide pin 150. The third connector 140 and the at least one guide pin 150 are both configured on the motherboard 110. The guide pin 150 is suitable for passing through the chassis 212 and guiding the second connector 211B to align with the motherboard connector 120. When the handle 220 rotates relative to the second frame 213 from the release position P1 to the locking position P2 with the rotating axis A1 as the axis, the handle 220 then pushes the protruding post 212A located in the first section 223A1 to move toward a position closer to the pivot portion 222, and drives the chassis 212 to slide relative to the second frame 213 toward the motherboard connector 120 and connects the second connector 211B to the motherboard connector 120. The blocking portion 221 of the handle 220 contacts the blocking flange 230A1 and the blocking flange 230B1 as described above, and resists the elastic force of the first elastic member 240, thereby driving the first frame 230A and the first frame 230B to slide relative to the device body 100 along the sliding direction D1. Relatively speaking, under the operation of the elastic force of the first elastic member 240 in the operating direction D2, the first frames 230A and 230B limit the movement of the handle 220 in the sliding direction D1. In the handle 220 of this embodiment, since a distance L2 between a point of application and the pivot portion 222 is greater than a distance L1 between the protruding post 212A and the pivot portion 222, a force applied is only required to be smaller than a friction between the second connector 211B and the motherboard connector 120 to remove or connect the second connector 211B to the motherboard connector 120, thereby becoming more labor-saving.

The overall operation of the detachment of the power distribution module 200 of this embodiment from the device body 100 is described below. In this embodiment, the handle 220 may also be rotated from the locking position P2 shown in FIG. 12C to the release position P1 shown in FIG. 12A with the rotating axis A1 as the axis. When the handle 220 is rotated from the locking position P2 shown in FIG. 12C to the position shown in FIG. 12B, the handle 220 pushes the protruding post 212A located in the first section 223A1 to move toward a junction of the first section 223A1 and second section 223A2 and drives the second connector 211B to be removed from the motherboard connector 120. In addition, the blocking portion 221 leaves the blocking flange 230A1 and the blocking flange 230B1 during the rotation process, the first elastic member 240 releases the elastic force, changing from the stretched state to the unstretched state, the first frame 230A and the second frame 230B slide relative to the device body 100 along the operating direction D2 by the elastic force of the respective first elastic members 240. When the handle 220 is rotated from the position shown in FIG. 12B to the release position P1 shown in FIG. 12A, the protruding post 212A is located in the second section 223A2 as described above, and the relative position between the chassis 212 and the second frame 213 is also maintained as before.

Figure 13:
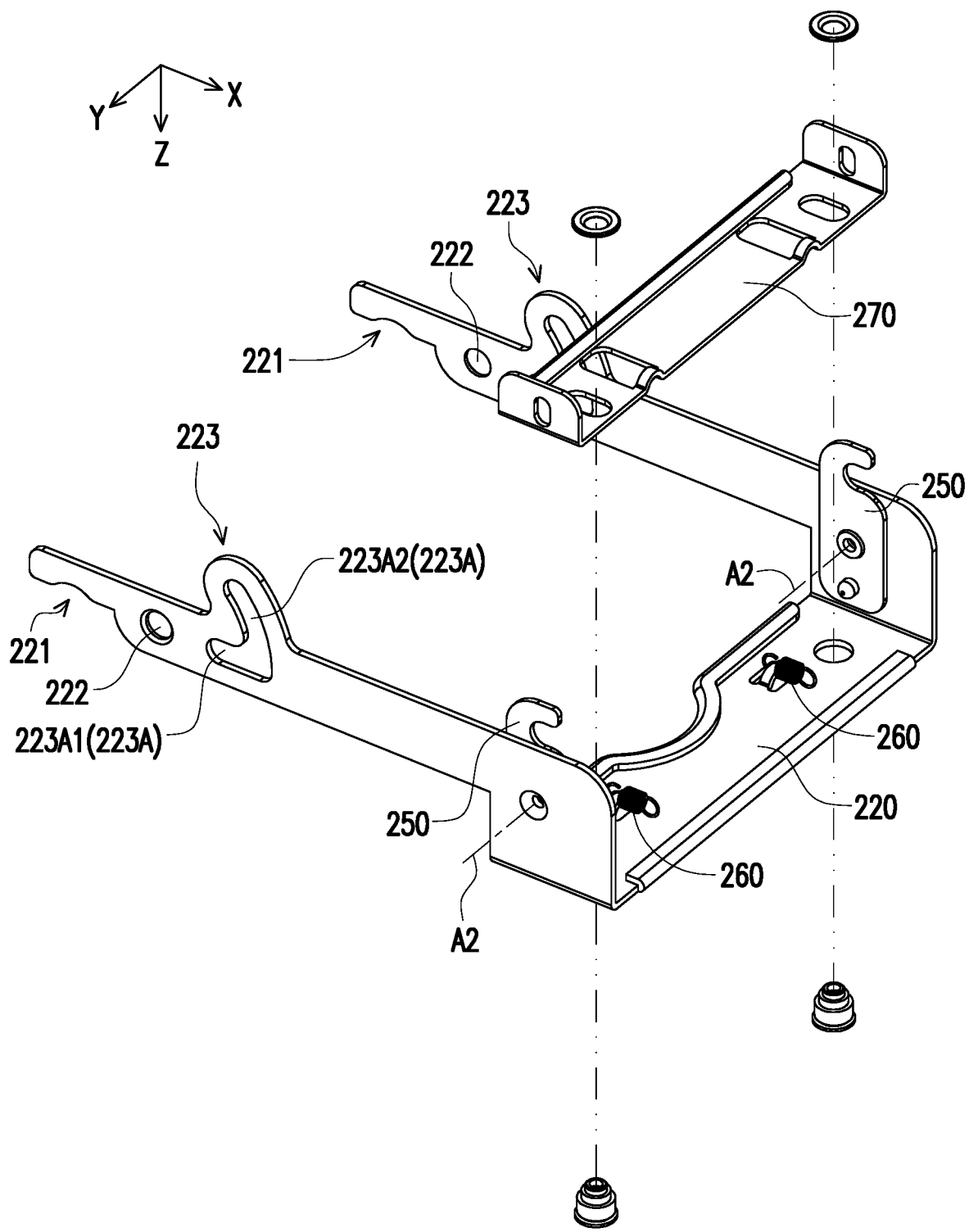
FIG. 13 is an exploded view of some components of the power distribution module of FIG. 1.

FIG. 13 is an exploded view of some components of the power distribution module of FIG. 1. Referring to FIG. 1 and FIG. 13, the power distribution module 200 of this embodiment includes at least one hook member 250 (two are shown), at least one third elastic member 260 (two are shown), and a linking member 270. The third elastic member 260 is connected between the linking member 270 and the handle 220, the hook member 250 is rotatably connected to the handle 220 and pivotally connected to the linking member 270. The hook member 250 is suitable for hooking with a hooking post 216 of the chassis 212, so that the handle 220 is maintained at the locking position P2 as shown in FIG. 1. The third elastic member 260 in this embodiment is a tension spring, but the disclosure is not limited thereto.

Figure 14A:
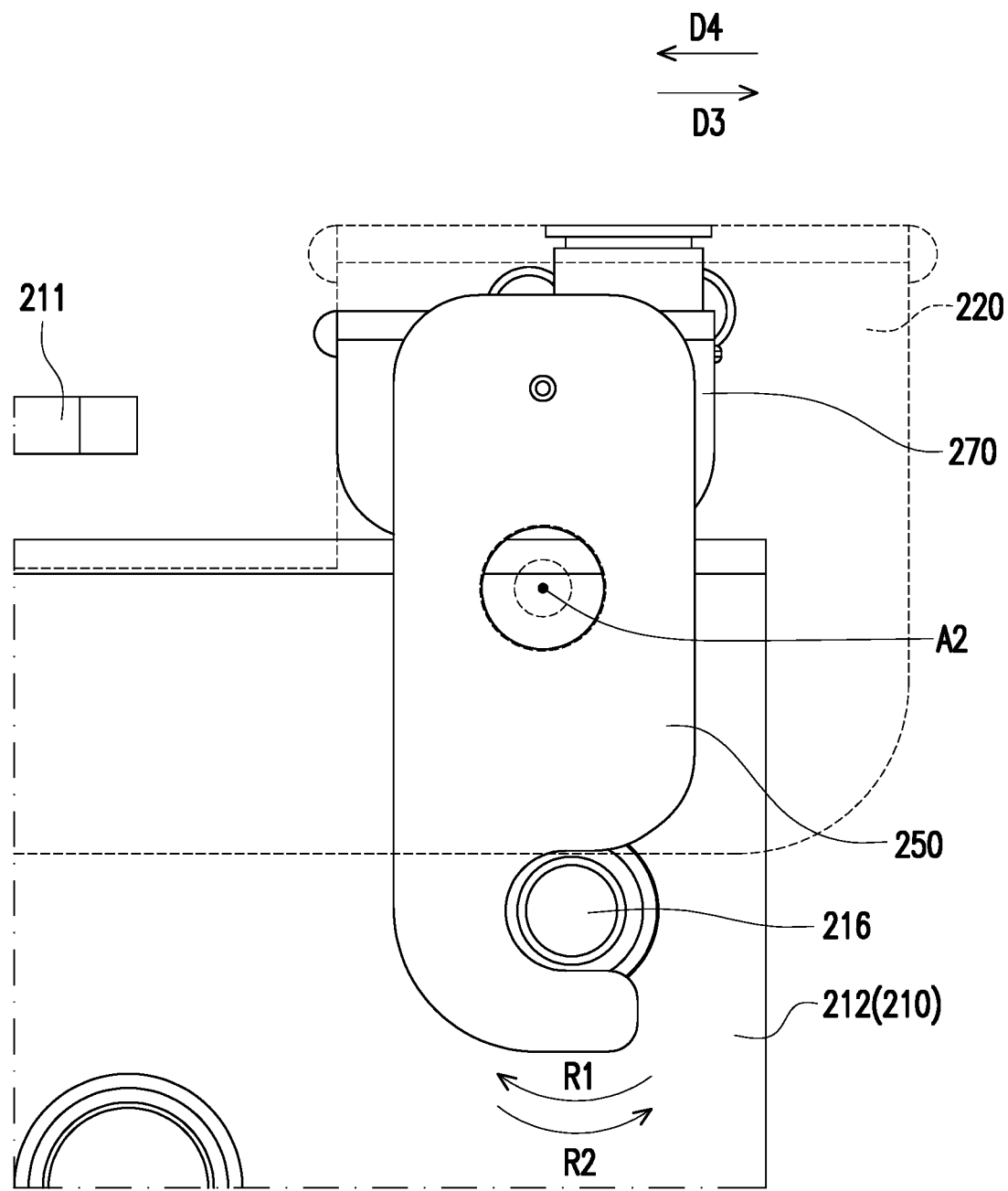
FIG. 14A and FIG. 14B are operation flowcharts of a hook member and a linking member of FIG. 10.
Figure 14B:
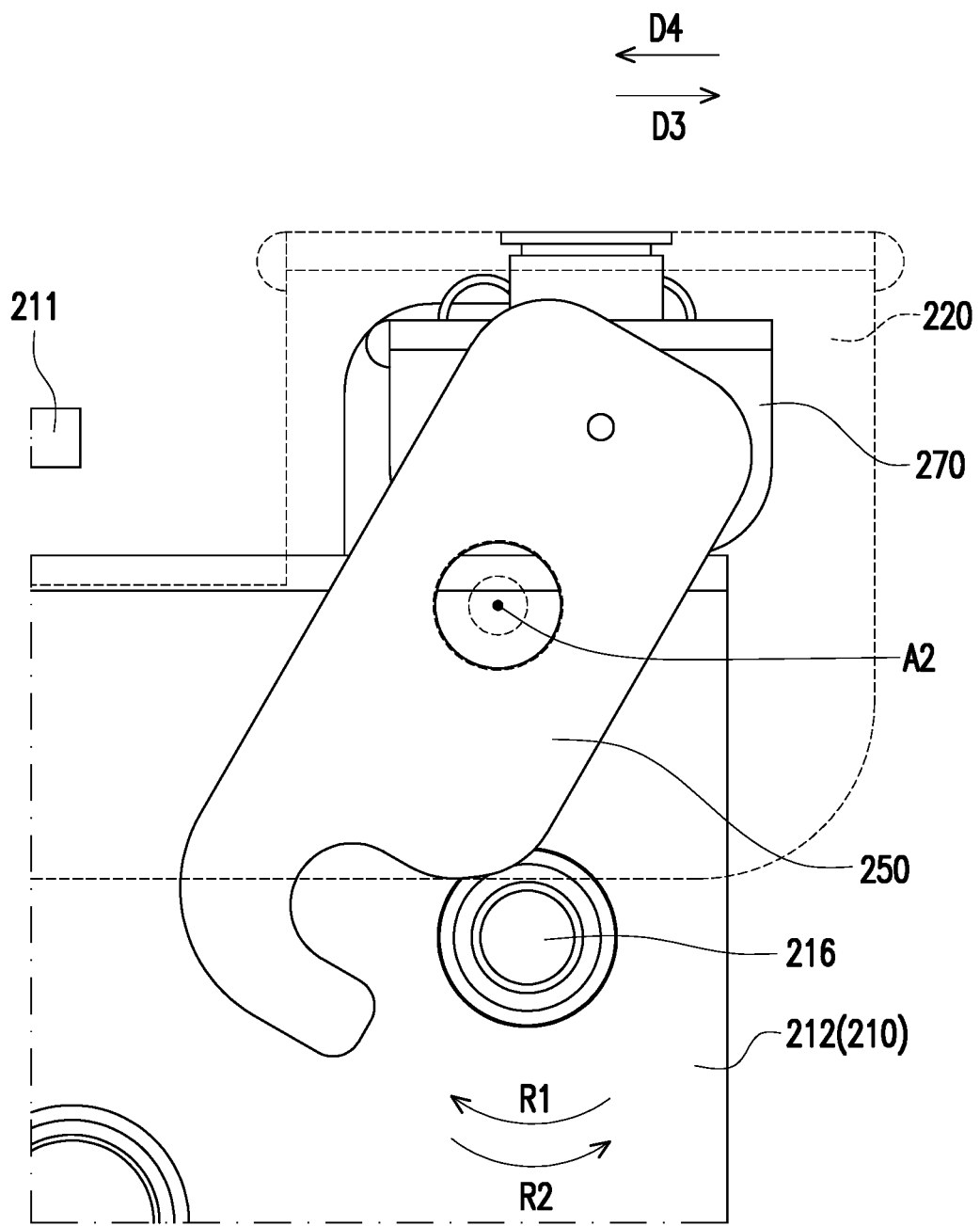

FIG. 14A and FIG. 14B are operation flowcharts of a hook member and a linking member of FIG. 10. Referring to FIG. 10, FIG. 14A, and FIG. 14B, the linking member 270 of this embodiment may be slidably disposed on the handle 220 along a sliding direction D3. When the linking member 270 is pressed along the sliding direction D3, the linking member 270 is suitable for resisting the elastic force generated by the stretching of the third elastic member 260 along the sliding direction D3, so that the hook member 250 pivotally connected to the linking member 270 rotates relative to the handle 220 along the rotating direction R1 with a rotating axis A2 as the axis, and separates the hooking post 216 of the chassis 212 to stay away from the main body 210, so that the handle 220 may rotate from the locking position P2 to the release position P1. When the pressed linking member 270 is released, the stretched third elastic member 260 releases the elastic force to pull the linking member 270 back to the initial position along a sliding direction D4, so that the hook member 250 is rotated relative to the handle 220 along a rotating direction R2 with the rotating axis A2 as the axis, and is hooked with the hooking post 216 of the chassis 212 to be hooked with the main body 210, so that the handle 220 may be maintained at the locking position P2.

Figure 15:
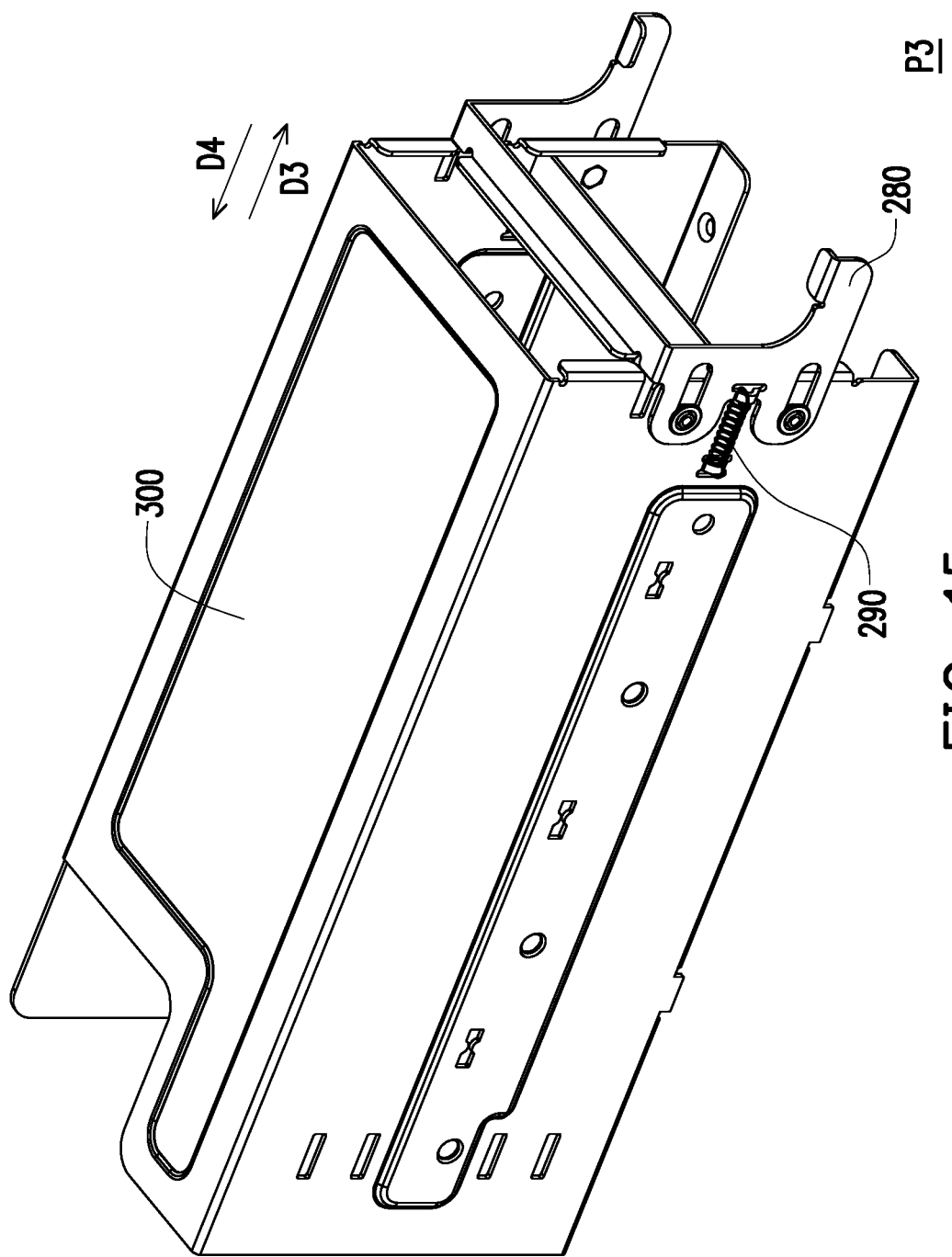
FIG. 15 is a perspective view of a box body and an anti-disassembly bracket of FIG. 1 located in a blocking position.
Figure 16:
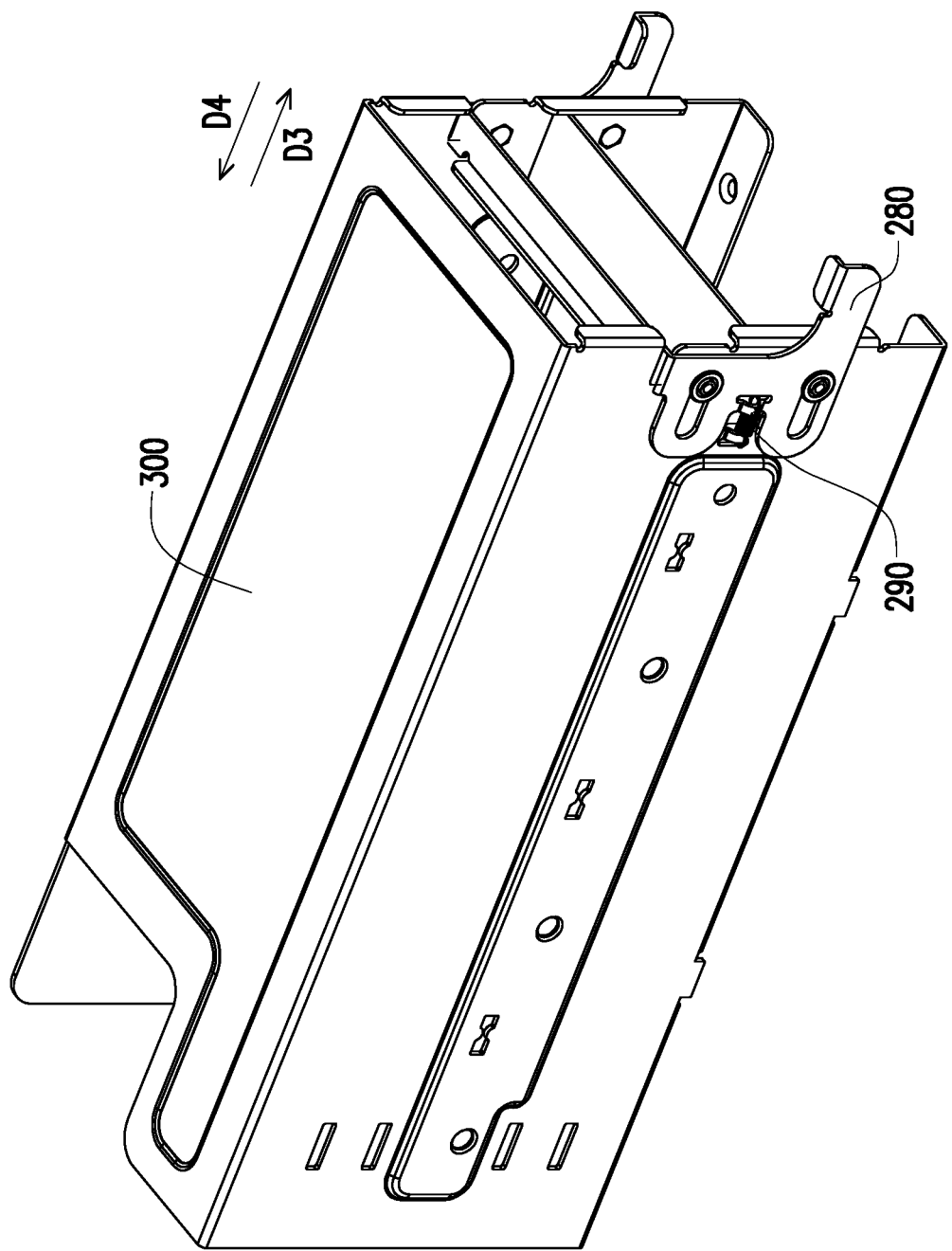
FIG. 16 is a perspective view of the anti-disassembly bracket of FIG. 15 moving away from the blocking position.

FIG. 15 is a perspective view of a box body and an anti-disassembly bracket of FIG. 1 located in a blocking position, FIG. 16 is a perspective view of the anti-disassembly bracket of FIG. 15 moving away from the blocking position. Referring to FIG. 1, FIG. 15, and FIG. 16, the electronic device 10 of this embodiment further includes a box body 300, and the power distribution module 200 further includes an anti-disassembly bracket 280 and at least one fourth elastic member 290, the number of the at least one fourth elastic member 290 is two. The box body 300 is configured on the motherboard 110, and the anti-disassembly bracket 280 is slidably disposed on the box body 300, the fourth elastic member 290 is connected between the anti-disassembly bracket 280 and the box body 300. The anti-disassembly bracket 280 may slide along the sliding direction D3 to a blocking position P3 as shown in FIG. 15, the fourth elastic member 290 is thereby stretched to generate an elastic potential energy. When the elastic potential energy is released, the stretched fourth elastic member 290 returns to the unstretched state along the sliding direction D4, and drives the anti-disassembly bracket 280 to move away from the blocking position P3 as shown in FIG. 16. The fourth elastic member 290 in this embodiment is a tension spring, but the disclosure is not limited thereto.

Figure 17A:
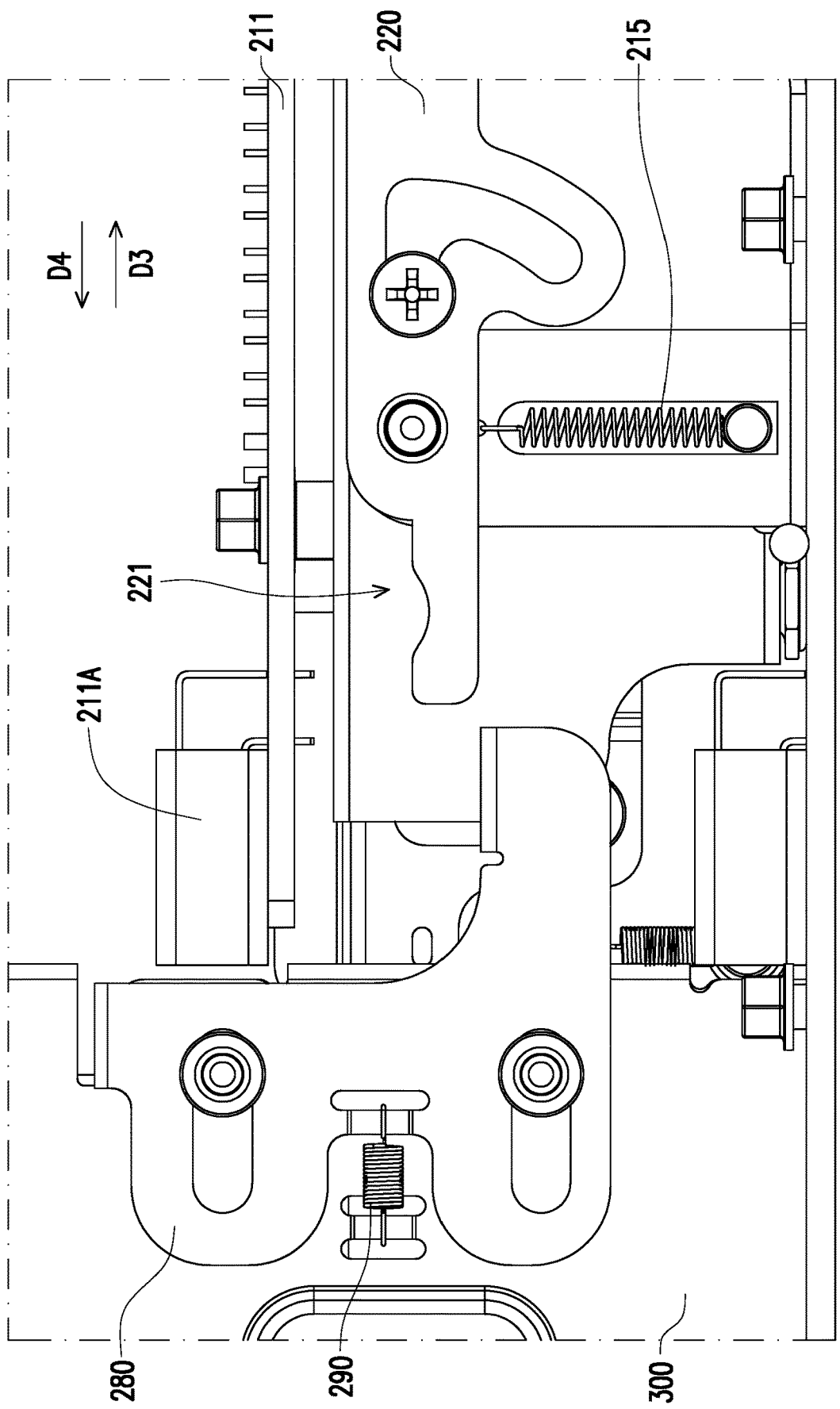
FIG. 17A is a side view of the anti-disassembly bracket of FIG. 1 located in the blocking position.
Figure 17B:
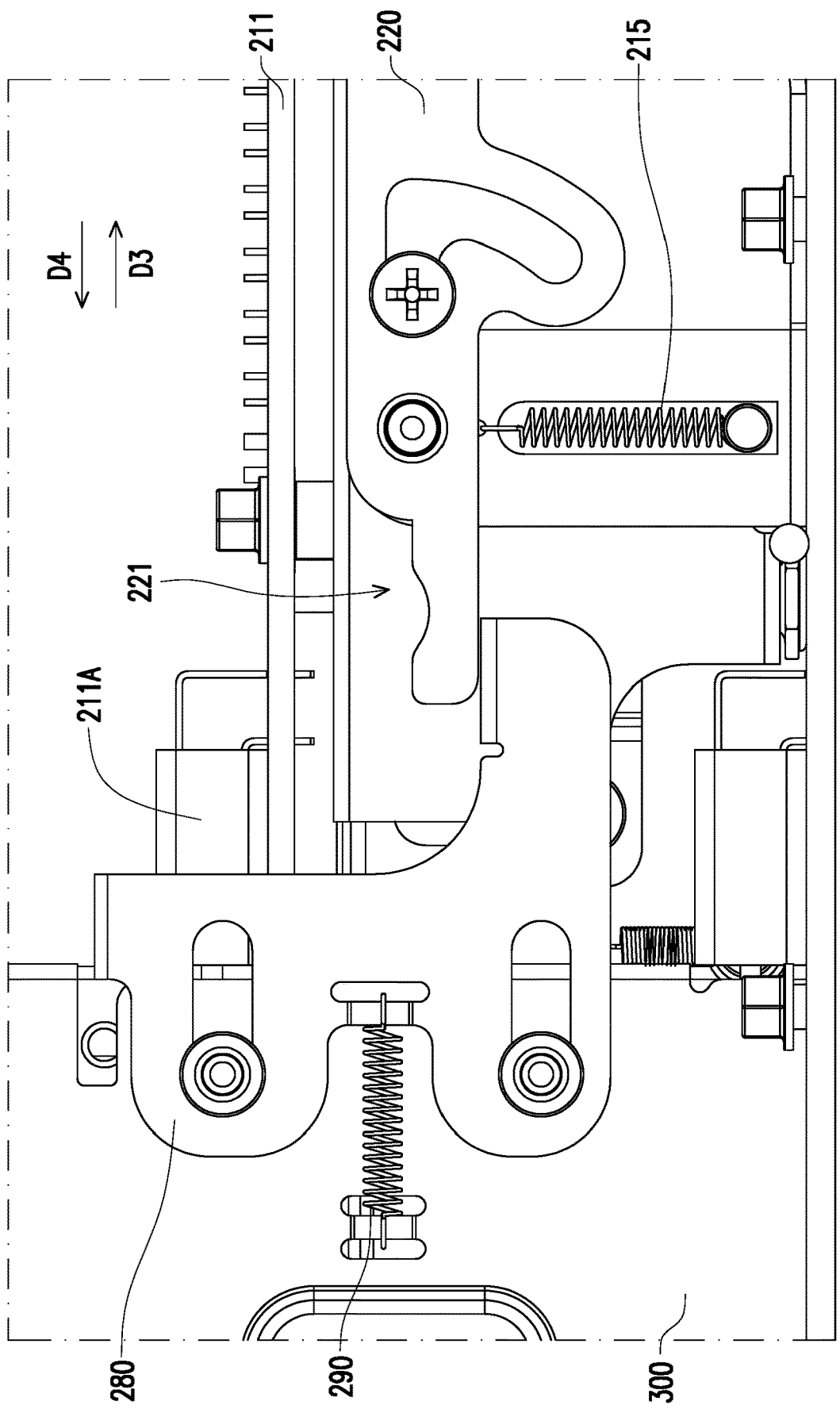
FIG. 17B is a side view of the anti-disassembly bracket of FIG. 1 moving away from the blocking position.

The operation of the anti-disassembly bracket 280 when the power supply module 400 is disposed in the box body 300 and the function of the anti-disassembly bracket 280 are described below. FIG. 17A is a side view of the anti-disassembly bracket of FIG. 1 located in the blocking position, FIG. 17B is a side view of the anti-disassembly bracket of FIG. 1 moving away from the blocking position. Referring to FIG. 1, FIG. 17A, and FIG. 17B, the electronic device 10 of this embodiment further includes at least one power supply module 400, and the interior of the box body 300 may be divided into an upper layer and a lower layer. The power supply module 400 may be disposed on both the upper and lower layers of the box body 300, and the power supply module 400 located on the lower layer of the box body 300 is suitable for connecting to the third connector 140. When the power supply module 400 is disposed on the upper layer of the box body 300 as shown in FIG. 1, the power supply module 400 is connected to the first connector 211A of the power adapter board 211. In addition, the anti-disassembly bracket 280 is pushed by the power supply module 400 to move to the blocking position P3, which is suitable for blocking the blocking portion 221 of the handle 220 at the locking position P2, preventing the handle 220 from being rotated from the locking position P2 to the release position P1 as described above.

Since the direction in which the power supply module 400 is plugged into the power distribution module 200 is different from the direction in which the power distribution module 200 is attached onto or removed from the device body 100, in the case that the power supply module 400 located on the upper layer of the box body 300 has not yet been removed, if the power distribution module 200 is directly detached, the docking structure of the power supply module 400 and the power distribution module 200 is easily damaged due to the forced movement of the power distribution module 200. In view of this, based on the above configuration of the anti-disassembly bracket 280 in this embodiment, when the anti-disassembly bracket 280 is located at the blocking position P3, the anti-disassembly bracket 280 may prevent the handle 220 from rotating to the release position P1 to prevent removing the power distribution module 200 before removing the power supply module 400 located on the upper layer of the box body 300, so as to avoid damage to the docking structure of the power supply module 400 and the power distribution module 200.

In this embodiment, when the power supply module 400 is moved away from the upper layer of the box body 300 and the anti-disassembly bracket 280 is released, the power supply module 400 is first removed from the first connector 211A of the power adapter board 211, the anti-disassembly bracket 280 is moved away from the blocking position P3 by the elastic force of the fourth elastic member 290, the handle 220 may thereby be rotated from the locking position P2 to the release position P1 as described above, the power distribution module 200 may thereby be removed from the device body 100.

To sum up, in the electronic device of the disclosure, when the handle of the power distribution module is pulled to drive the main body of the power distribution module to move toward the device body of the electronic device, the first frame slidably disposed on the device body is driven by the handle to move upwards, so that the first elastic member connected between the device body and the first frame is stretched. Therefore, the first frame limits the main body of the power distribution module to the device body by the elastic force of the first elastic member, so that the main body of the power distribution module is firmly plugged into the device body. In addition, the anti-disassembly bracket located at the blocking position may prevent the handle from rotating to the release position, which may prevent the removal of the power distribution module before removing the power supply module located on the upper layer of the box body, so as to avoid damage to the docking structure of the power supply module and the power distribution module. Furthermore, in terms of the handle, since the distance between the point of application and the pivot portion is greater than the distance between the protruding post and the pivot portion, the force applied is only required to be smaller than the friction between the second connector and the motherboard connector to remove or connect the second connector to the motherboard connector, thereby becoming more labor-saving.

What is claimed is:

1. An electronic device, comprising:
   a device body;
   a power distribution module, comprising:
      at least one first frame, slidably disposed on the device body,
      a main body, detachably disposed on the device body;
      a handle, rotatably connected to the main body; and
      at least one first elastic member, connected between the device body and the at least one first frame, wherein the at least one first frame blocks the handle by an elastic force of the at least one first elastic member, so that the main body is limited on the device body;
   a box body; and
   at least one power supply module, wherein the power distribution module comprises an anti-disassembly bracket, the anti-disassembly bracket is slidably disposed on the box body, the anti-disassembly bracket is suitable for blocking the handle from rotating relative to the main body.

2. The electronic device according to claim 1, wherein when the handle is rotated relative to the main body from a release position to a locking position, the handle resists the elastic force of the at least one first elastic member to drive the at least one first frame to slide relative to the device body.

3. The electronic device according to claim 1, wherein the power distribution module comprises at least one hook member, at least one third elastic member, and a linking member, the at least one third elastic member is connected between the linking member and the handle, the at least one hook member is rotatably connected to the handle and is pivotally connected to the linking member, the linking member is suitable for hooking the at least one hook member to the main body through the at least one third elastic member to position the handle.

4. The electronic device according to claim 1, wherein the main body comprises a chassis and at least one second frame, the at least one second frame is slidably disposed on the chassis, the handle is rotatably connected to the at least one second frame and is slidably disposed on the chassis, the device body has a motherboard connector, the handle is suitable for driving the chassis to slide relative to the motherboard connector.

5. The electronic device according to claim 4, wherein the main body comprises at least one second elastic member, the at least one second elastic member is connected between the chassis and the at least one second frame.

6. The electronic device according to claim 4, wherein the at least one first frame is slidably disposed on the device body along a sliding direction, the at least one second frame is slidably disposed on the chassis along the sliding direction.

7. The electronic device according to claim 4, wherein the handle comprises a pivot portion, a blocking portion, and a sliding portion, the pivot portion is located between the blocking portion and the sliding portion and is pivotally connected to the at least one second frame, the blocking portion is suitable for being blocked by the at least one first frame, the sliding portion is slidably disposed on the chassis.

8. The electronic device according to claim 4, wherein the handle comprises a sliding portion, the sliding portion comprises a sliding slot, the chassis comprises a protruding post, the protruding post is slidably disposed on the sliding slot, the sliding slot comprises a first section and a second section respectively extending in different directions, the protruding post slides on the first section and the second section through the handle.

9. The electronic device according to claim 1, wherein the power distribution module comprises at least one fourth elastic member, the at least one fourth elastic member is connected between the box body and the anti-disassembly bracket, the power supply module is disposed inside the box body so that the anti-disassembly bracket is limited on a blocking position, when the power supply module is moved away from the box body, the anti-disassembly bracket is moved away from the blocking position by an elastic force of the at least one fourth elastic member.

10. A power distribution module, suitable for an electronic device, the power distribution module comprising:
    at least one first frame, slidably disposed on a device body of the electronic device;
    a main body, detachably disposed on the device body;
    a handle, rotatably connected to the main body;
    at least one first elastic member, connected between the device body and the at least one first frame, wherein the at least one first frame blocks the handle by an elastic force of the at least one first elastic member, so that the main body is limited on the device body;
    a box body; and
    at least one power supply module, the power distribution module comprises an anti-disassembly bracket, the anti-disassembly bracket is slidably disposed on the box body, the anti-disassembly bracket is suitable for blocking the handle from rotating relative to the main body.

11. The power distribution module according to claim 10, wherein when the handle is rotated relative to the main body from a release position to a locking position, the handle resists the elastic force of the at least one first elastic member to drive the at least one first frame to slide relative to the device body.

12. The power distribution module according to claim 10, comprising at least one hook member, at least one third elastic member, and a linking member, wherein the at least one third elastic member is connected between the linking member and the handle, the at least one hook member is rotatably connected to the handle and is pivotally connected to the linking member, the linking member is suitable for hooking the at least one hook member to the main body through the at least one third elastic member to position the handle.

13. The power distribution module according to claim 10, wherein the main body comprises a chassis and at least one second frame, the at least one second frame is slidably disposed on the chassis, the handle is rotatably connected to the at least one second frame and is slidably disposed on the chassis, the handle is suitable for driving the chassis to slide relative to the at least one second frame.

14. The power distribution module according to claim 13, wherein the main body comprises at least one second elastic member, the at least one second elastic member is connected between the chassis and the at least one second frame.

15. The power distribution module according to claim 13, wherein the at least one first frame is slidably disposed on the device body along a sliding direction, the at least one second frame is slidably disposed on the chassis along the sliding direction.

16. The power distribution module according to claim 13, wherein the handle comprises a pivot portion, a blocking portion, and a sliding portion, the pivot portion is located between the blocking portion and the sliding portion and is pivotally connected to the at least one second frame, the blocking portion is suitable for being blocked by the at least one first frame, the sliding portion is slidably disposed on the chassis.

17. The power distribution module according to claim 13, wherein the handle comprises a sliding portion, the sliding portion comprises a sliding slot, the chassis comprises a protruding post, the protruding post is slidably disposed on the sliding slot, the sliding slot comprises a first section and a second section respectively extending in different directions, the protruding post slides on the first section and the second section through the handle.

18. The power distribution module according to claim 10, comprising at least one fourth elastic member, wherein the at least one fourth elastic member is connected between the box body and the anti-disassembly bracket, the power supply module is disposed inside the box body so that the anti-disassembly bracket is limited on a blocking position, when the power supply module is moved away from the box body, the anti-disassembly bracket is moved away from the blocking position by an elastic force of the at least one fourth elastic member.

* * * * *